(12) United States Patent
Nickel et al.

(10) Patent No.: US 9,000,989 B2
(45) Date of Patent: Apr. 7, 2015

(54) TEST SYSTEM WITH ADJUSTABLE RADIO-FREQUENCY PROBE ARRAY

(75) Inventors: Joshua G. Nickel, San Jose, CA (US); Jerzy Guterman, Mountain View, CA (US); Mattia Pascolini, San Mateo, CA (US); Chun-Lung Chen, Sunnyvale, CA (US); Joss Nathan Giddings, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 251 days.

(21) Appl. No.: 13/212,108

(22) Filed: Aug. 17, 2011

(65) Prior Publication Data
US 2013/0044033 A1 Feb. 21, 2013

(51) Int. Cl.
*G01R 29/08* (2006.01)
*G01R 29/10* (2006.01)
*G01R 31/28* (2006.01)

(52) U.S. Cl.
CPC ............ *G01R 29/10* (2013.01); *G01R 31/2824* (2013.01)

(58) Field of Classification Search
CPC .. G01R 29/10; G01R 29/0878; G01R 29/105; G01R 29/0871; G01R 29/0828; G01R 29/082888; G01R 29/08
USPC .............. 343/703, 702, 700 MS; 324/501, 95
See application file for complete search history.

(56) References Cited

U.S. PATENT DOCUMENTS

| | | | |
|---|---|---|---|
| 5,594,358 A | 1/1997 | Ishikawa et al. | |
| 5,945,835 A * | 8/1999 | McDonough et al. | ... 324/750.25 |
| 7,053,643 B2 | 5/2006 | Ruff et al. | |
| 7,188,037 B2 * | 3/2007 | Hidehira | ......................... 702/58 |
| 7,403,028 B2 * | 7/2008 | Campbell | ................ 324/755.03 |
| 7,750,652 B2 * | 7/2010 | Campbell | ................ 324/756.06 |
| 7,915,909 B2 | 3/2011 | Dunn et al. | |
| 8,069,491 B2 * | 11/2011 | Lesher | ............................ 850/19 |
| 8,410,806 B2 * | 4/2013 | Smith | ...................... 324/755.01 |
| 2011/0124364 A1 | 5/2011 | Donovan et al. | |
| 2012/0068727 A1 * | 3/2012 | Rathburn | ................. 324/755.01 |
| 2012/0262188 A1 * | 10/2012 | Nickel et al. | .................. 324/629 |

* cited by examiner

*Primary Examiner* — Huedung Mancuso
(74) *Attorney, Agent, or Firm* — Treyz Law Group; Chih-Yun Wu; Michael H. Lyons

(57) ABSTRACT

Electronic device structures may be tested using a radio-frequency test system. The radio-frequency test system may include radio-frequency test equipment and an associated test fixture. The radio-frequency test equipment may be used in generating and measuring radio-frequency signals. The test fixture may contain adjustable structures that allow the positions of radio-frequency test probes to be adjusted. The test system may be configured to position radio-frequency probes in the test fixture so that some probe contacts form electrical connections with conductive antenna structures. The radio-frequency probes may contain other contacts that are positioned to form electrical connections with conductive electronic device housing structures. During radio-frequency testing, the test equipment in the test system may apply radio-frequency test signals to the device structures under test using the test probes. Corresponding radio-frequency test signals may be measured by the test equipment.

16 Claims, 20 Drawing Sheets

TEST SYSTEM WITH ADJUSTABLE RADIO-FREQUENCY PROBE ARRAY

BACKGROUND

This relates generally to test fixtures and more particularly, to test fixtures that are used to test electronic devices.

Wireless electronic devices typically include transceiver circuitry, antenna circuitry, and other radio-frequency circuitry that provide wireless communications capabilities. During testing, wireless electronic devices under test (DUTs) can each exhibit different performance levels. For example, each wireless DUT can exhibit its own output power level, gain, frequency response, efficiency, linearity, dynamic range, and other performance characteristics.

It can be challenging to make satisfactory measurements on electronic device structures, particularly in manufacturing environments in which low cost, low complexity, high manufacturing volumes, and high test accuracy are desired.

It would therefore be desirable to be able to provide improved techniques and systems for testing electronic device structures such as antenna structures and other structures associated with electronic devices.

SUMMARY

Electronic device structures such as structures associated with wireless electronic devices may be tested using a radio-frequency test system. The radio-frequency test system may include radio-frequency test equipment and an associated test fixture. The radio-frequency test equipment may be used in generating and measuring radio-frequency signals.

The test fixture may contain adjustable structures that allow the positions of radio-frequency test probes to be adjusted. The test fixture may allow radio-frequency test probes to be positioned in three dimensions (e.g., along first, second, and third orthogonal axes or dimensions in three dimensional space). The test fixture may include an adjustable test stage that provides support for device structures under test. The device structures under test may be all or part of the structures associated with an electronic device such as a wireless electronic device. As an example, the device structures under test may include antenna resonating element structures and conductive housing structures such as portions of a portable computer housing or housing structures for other electronic devices. The conductive housing structures and antenna resonating element structures may be used in forming an array of antennas in a completed electronic device.

To test device structures such as device structures that contain antenna structures, the test system may be configured to position radio-frequency probes in the test fixture so that some probe contacts in the probes form electrical connections with conductive antenna structures. The conductive antenna structures may, for example, be conductive antenna traces mounted on a substrate such as a plastic carrier. The radio-frequency probes may contain other contacts that are positioned to form electrical connections with conductive electronic device housing structures.

During radio-frequency testing, the test equipment in the test system may apply radio-frequency test signals to the device structures under test using the test probes. Corresponding radio-frequency test signals may be measured by the test equipment. As an example, radio-frequency tests may be performed to gather complex impedance measurements and complex forward transfer coefficient measurements. These measurements and other gathered test data may be compared to previously obtained baseline measurements on properly assembled structures to determine whether the electronic device structures under test contain a fault. For example, radio-frequency test measurements may be used to determine whether conductive antenna traces have been properly grounded to portions of a conductive device housing structure.

Further features of the present invention, its nature and various advantages will be more apparent from the accompanying drawings and the following detailed description.

DETAILED DESCRIPTION

Figure 1:
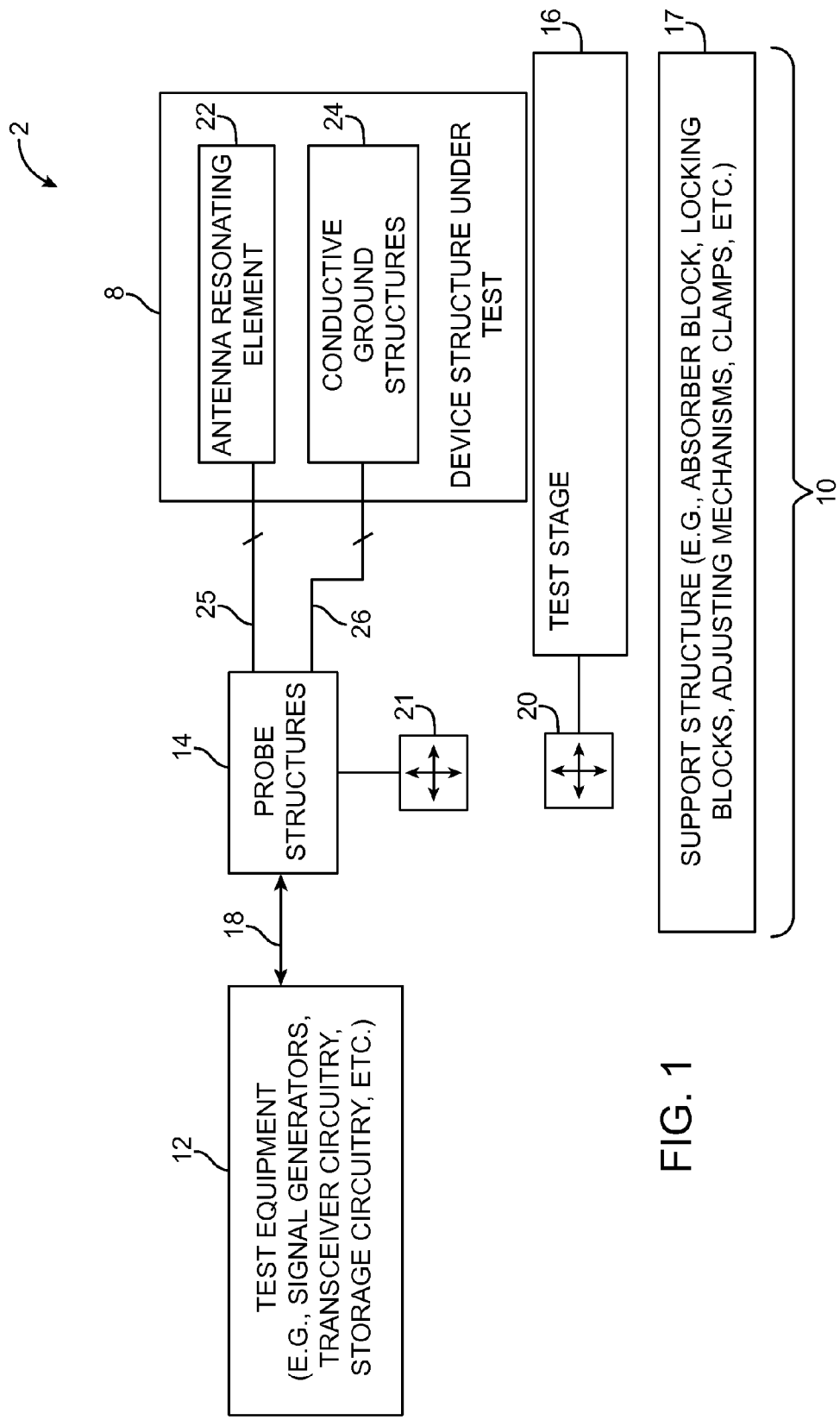
FIG. 1 is an illustrative diagram of a test system that may include a test fixture and test equipment for testing a radio-frequency device in accordance with an embodiment of the present invention.

This relates to test systems for testing electronic device structures. Electronic device structures may be tested to reveal the presence of faults during manufacturing. If a fault is detected, the device structures under test may be reworked or scrapped before additional manufacturing operations are performed.

The test systems may use radio-frequency test equipment to generate and measure radio-frequency signals. The test equipment may, for example, generate radio-frequency signals in a range of about 0-6 GHz (as an example). The radio-frequency signals may be applied to device structures under test using one or more radio-frequency test probes. During testing, the radio-frequency test equipment may gather corresponding radio-frequency test data (e.g., test data for computing complex impedance values and/or complex forward transfer coefficient values). The test data that is gathered in this way may be used in determining whether the tested structures are satisfactory or contain faults.

In other words, radio-frequency testing may be performed on electronic device structures (e.g., electronic device structures that have many antenna resonating elements and an antenna ground structure) by applying radio-frequency signals to the electronic device structures through radio-frequency probes from test equipment and receiving radio-frequency signals at the test equipment from the electronic device structures through the radio-frequency probes.

The radio-frequency test probe equipment that is used in applying radio-frequency test signals to the device structures under test and that is used in gathering corresponding radio-frequency test measurements may be mounted in a test fixture.

Any suitable electronic device structures that are sensitive to radio-frequency testing may be tested using the test system. For example, electronic devices such as wireless electronic devices may be tested after some or all components within the devices have been assembled. Partially formed devices may also be tested. For example, portions of a device housing and/or other structures such as antenna structures may be tested. These structures and devices are sometimes referred to as devices under test and/or device structures under test.

Examples of device structures under test that may be tested using the test system include structures associated with electronic devices such as desktop computers, computer monitors, computer monitors containing embedded computers, wireless computer cards, wireless adapters, televisions, set-top boxes, gaming consoles, routers, or other electronic equipment. Examples of portable wireless electronic device structures that may be tested include structures associated with cellular telephones, laptop computers, tablet computers, handheld computers, media players, and small devices such as wrist-watch devices, pendant devices, headphone and earpiece devices, and other miniature devices. Examples of test units (sometimes referred to as test boxes or test equipment) that may be used in the test system include network analyzers (e.g., vector network analyzers), spectrum analyzers, oscilloscopes, and other radio-frequency testers.

Test system 2 in FIG. 1 shows an illustrative system that may be used to test a device under test 8. Test system 2 may include test equipment 12 and a test fixture 10 that may hold a device under test 8. During manufacturing testing, device under test 8 (e.g., device structures under test that are associated with an electronic device such as a wireless device) may be tested in test fixture 10 as shown in FIG. 1. Test fixture 10 may be coupled to test equipment 12 via cables 18. Cables 18 may be cables such as coaxial cables that are suitable for transmitting radio-frequency (RF) signals. Test fixture 10 may be used by test equipment 12 to test electronic device 8. Test fixture 10 may include probe structures 14, a test stage 16, a support structure 17, an adjusting mechanism 20 for physically adjusting test stage 16 and an adjusting mechanism 21 for physically adjusting probe structures 14.

Test system 2 may be used to detect faults in conductive housing structures, faults associated with welds or solder joints between conductive structures, antenna structure faults, faults in connector structures such as connector structures coupled to cables and printed circuit boards or other conductive structures that form electrical connections, faults in conductive traces, faults in conductive surfaces, faults in dielectric structures adjacent to conductive structures, faults in structures that include components that are electrically connected using springs or other contacts, or faults in other device structures under test 8. Any fault that affects the electromagnetic properties of device structures under test 8 and therefore affects radio-frequency test data that is gathered using test equipment 12 may potentially be detected using test system 2. For example, radio-frequency testing may identify faults associated with insufficient electrical coupling between antenna resonating elements and ground structures.

Test equipment (tester) 12 may be a radio communications tester of the type that is sometimes referred to as a test box or a universal radio communications tester. Testers of this type may perform radio-frequency signaling tests for a variety of different radio-frequency communications bands and channels. Test equipment 12 may include signal generator equipment that generates radio-frequency signals over a range of frequencies. Test equipment 12 may also include radio-frequency transceiver circuitry that is able to transmit the radio-frequency signals and able to gather information on the magnitude and phase of corresponding received signals from device structures under test 8 and may include one or more displays for displaying the gathered information. Test equipment 12 may include processing circuitry that can process the gathered information (e.g., by comparing the gathered information to reference information). Using the transmitted and received signals, the magnitude and phase of the complex impedance and/or complex forward transfer coefficient of the device structures under test may be determined. With one suitable arrangement, test equipment 12 may be a vector network analyzer (VNA) or other network analyzer and a computer that is coupled to the vector network analyzer for gathering and processing test results. This is, however, merely illustrative. Test equipment 12 may include any suitable equipment for generating radio-frequency test signals of desired frequencies while measuring and processing corresponding received signals.

For example, test equipment 12 may perform S-parameter tests such as input reflection coefficient tests (S11 tests) that measure input reflection coefficients at desired test points (e.g., locations) on the device structure under test. If desired, any type of radio-frequency tester may be used to test device 8.

Test equipment 12 may be coupled to probe structures 14 via radio-frequency (RF) paths 18. RF paths 18 may be formed from cables such as coaxial cables that are suitable for transmitting RF signals to probe structures 14. Probe structures 14 may be coupled to a device under test via coupling paths 25 and 26. Coupling path 25 may couple probe structures 14 and an antenna resonating element 22 of device under test 8. Coupling path 26 may couple probe structures 14 to conductive ground structures 24 of device under test 8. Probe structures 14 may be physically adjustable via adjusting mechanism 21. Adjusting mechanism 21 may adjust probe structures 14 to contact device under test 8 (e.g., coupling paths 25 and 26 may be provided by adjusting probe structures 14 to physically contact DUT 8). If desired, adjusting mechanism 21 may be formed as part of probe structures 14. Adjusting mechanism 21 may sometimes be referred to as adjustable probe positioning structures (e.g., adjustable structures that position radio-frequency probes to contact DUT 8).

The scenario of FIG. 1 showing probe structures 14 coupled to antenna resonating element 22 and conductive ground structures 24 is merely illustrative. Probe structures 14 may be coupled to any desired locations of device structures under test 8 that may contain structural faults.

Device under test (DUT) 8 may be located on a test stage 16 that provides structural support during testing. Test stage 16 may be adjusted via adjusting mechanism 20 to more precisely control contacts between probe structures 14 and test points on DUT 8. For example, adjusting mechanism 20 may allow a device under test to be moved closer to or further from probe structures 14.

Figure 2:
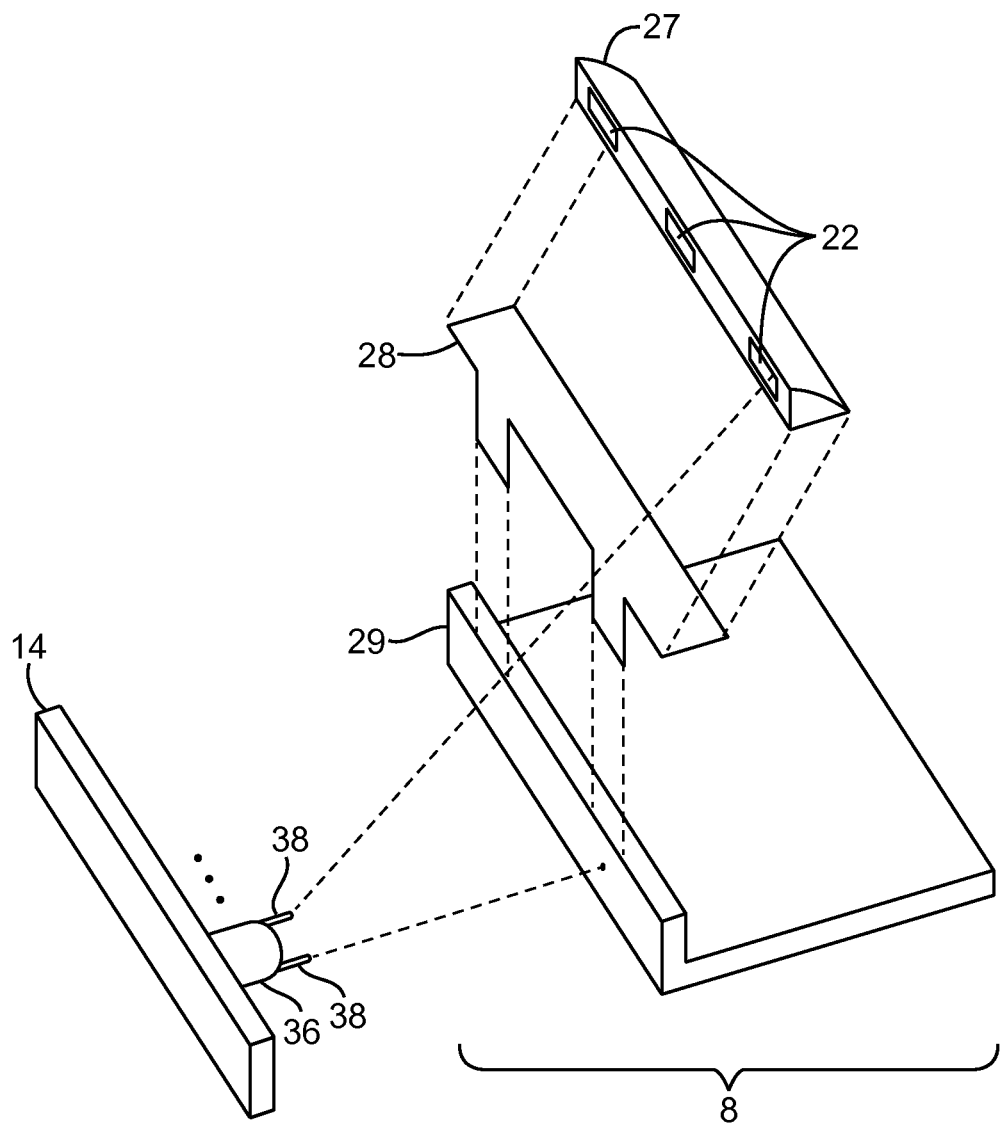
FIG. 2 is an illustrative diagram of adjustable probe structures that may be coupled to a device under test in accordance with an embodiment of the present invention.

FIG. 2 shows an illustrative device structure under test 8 that may be coupled to probe structures 14. As shown in FIG. 2, DUT 8 may include a housing unit 27 (e.g., a non-conductive plastic housing unit) with antenna resonating elements 22. Antenna resonating elements 22 may be partially enclosed by housing unit 27. Housing unit 27 may be located on a conductive grounding plate 28 that is electrically coupled to a conductive support structure 29 (e.g., a metal laptop housing structure). Conductive grounding plate 28 may be coupled to conductive support structure 29 using conductive flaps that clasp support structure 29. Conductive grounding plate 28 and conductive support structure 29 may form a conductive grounding structure that couples to antenna resonating elements 22.

Probe structures 14 may include probes 36. Probe contacts 38 (sometimes referred to herein as probe conductors) may be inserted into probes 36 and probe structure 14 may be configured so that the probes contact desired test points on antenna resonating elements 22 and conductive support structure 29. For example, to perform reflection coefficient testing, probe structure 14 may be adjusted to position a first probe contact 38 to contact a first desired test point on resonating elements 22 and position a second test probe contact 38 to contact a second desired test point on conductive support structure 29. Test procedures may be performed using probes 36 (and probe contacts 38) that have been positioned at desired locations to test the integrity of the electrical coupling between conductive support structure 29 and antenna resonating elements 22 (e.g., by performing reflection coefficient testing).

During testing, probes 36 may be used to communicate with each other. For example, test signals may be transmitted from a first probe 36 that contacts support structure 29 at a first location and received at a second probe that contacts support structure 29 at a second location. In this scenario, conductive support structure 29 and conductive grounding plate 28 may form an electrical signal path for the test signals (e.g., for forward impedance test signals transmitted by a first probe coupled to antenna resonating element 22 and conductive support structure 29 and received by a second probe coupled to antenna resonating element 22 at a different location and conductive support structure 29).

Figure 3:
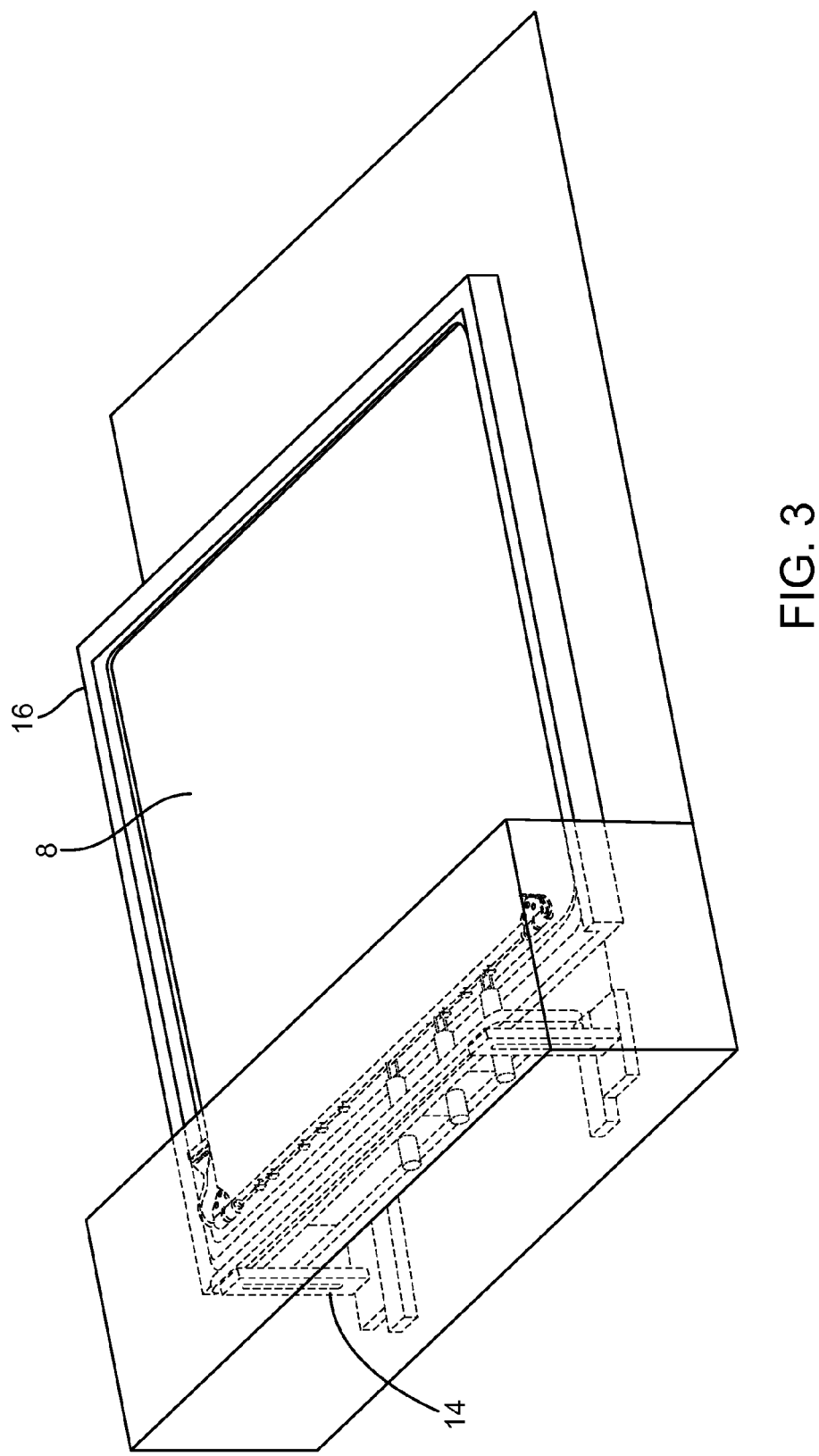
FIG. 3 is an illustrative diagram of a test stage that may hold a device under test in accordance with an embodiment of the present invention.

FIG. 3 shows an illustrative DUT 8 located on a test stage 16 (sometimes referred to herein as a testing platform). Test stage 16 may provide support for DUT 8 during test procedures (e.g., by holding DUT 8 at a desired location). Probe structures 14 may be used for testing DUT 8. For example, probe structures 14 may include test probes, probe contacts and adjustable mechanisms for positioning the test probes at desired locations for testing DUT 8.

Figure 4:
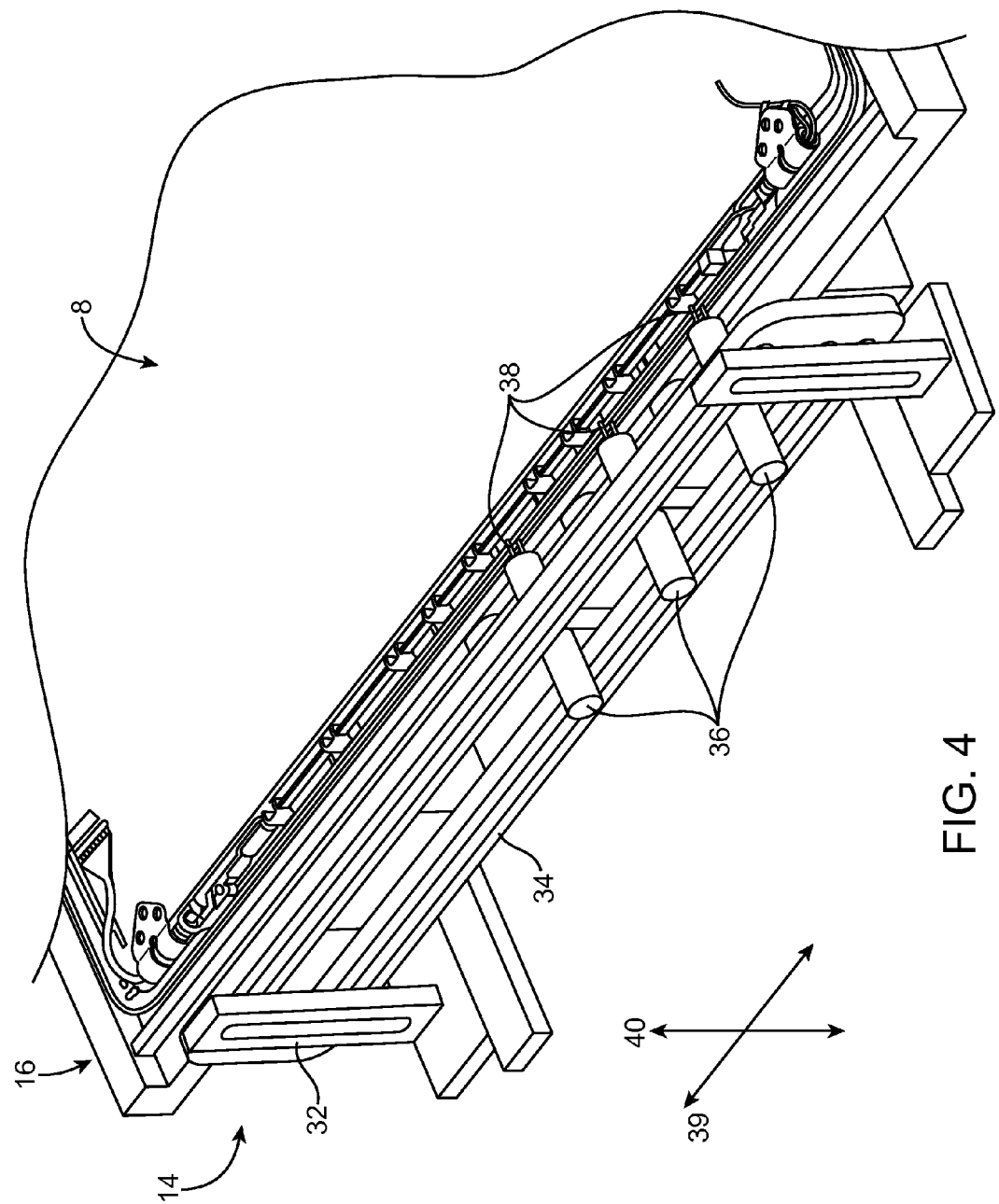
FIG. 4 shows an illustrative close-up view of adjustable probe structures with probes that may be coupled to a device under test in accordance with an embodiment of the present invention.

FIG. 4 shows an illustrative close-up view of probe structures 14 that may be electrically coupled to DUT 8. As shown in FIG. 4, probe structures 14 may include probes 36 with probe contacts 38 and adjustable structures 32 (e.g., plastic sliding brackets or metal sliding brackets). Adjustable structures 32 may allow the locations of probes 36 to be adjusted to contact desired test points on DUT 8. For example, adjustable structures 32 may allow probes 36 to be adjusted along a horizontal axis 39 or a vertical axis 40 (e.g., adjusted left or right along a horizontal axis of adjustable structures 32 or adjusted up and down along a vertical axis of adjustable structures 32). The positions of probes 36 may be adjusted vertically and horizontally by adjustable structures 32 to contact desired test points on DUT 8. If desired, the positions of probes 36 may be adjusted towards and away from DUT 8. Adjustable structures 32 may be formed as part of adjusting mechanisms such as adjusting mechanism 21 of FIG. 1.

Figure 5:
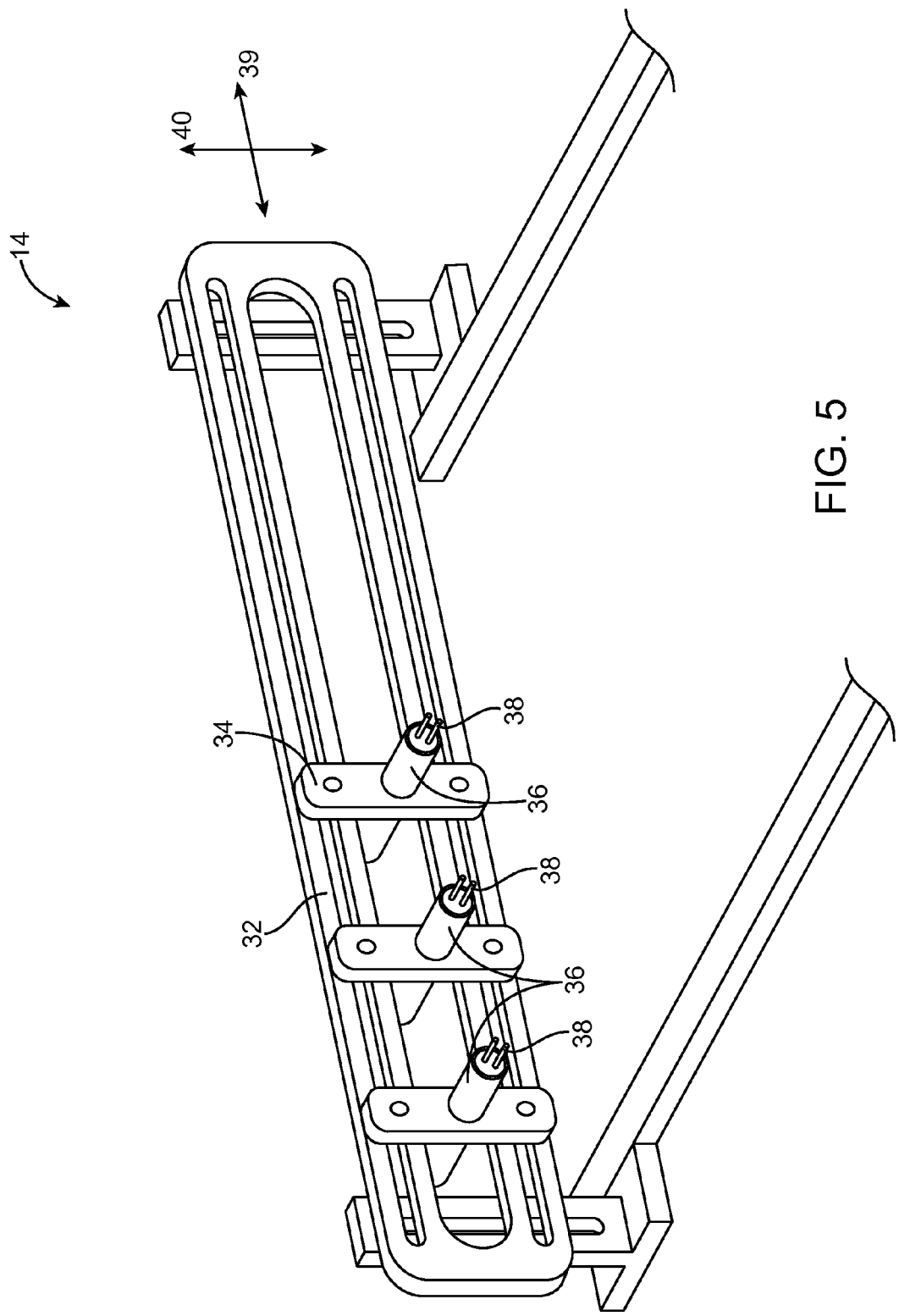
FIG. 5 shows an illustrative close-up view of adjustable probe structures with probes in accordance with an embodiment of the present invention.

FIG. 5 shows an illustrative close-up view of probe structures 14 that may be used to provide test probes with adjustable positioning. As shown in FIG. 5, probe structures 14 may include adjustable structures 32, probe mounts 34, probes 36, and removable probe contacts 38. Probe mount 34 may be formed from a non-conductive material (e.g., plastic) to help prevent electrical coupling between adjustable structures 32 and probes 36. For example, a non-conductive probe mount 34 may help prevent test signals that are conveyed or received through probes 36 from being shorted to adjustable structures 32.

The position of probe mounts 34 may be adjustable along the length of probe mount 34 (e.g., in a horizontal direction along horizontal axis 39). The position of probe mount 34 may be adjustable along the height of adjustable structures 14 (e.g., in a vertical direction along vertical axis 40). Probe contacts 38 may be inserted or removed from probes 36 as desired for testing. The number of probes 36 and corresponding probe contacts 38 may be selected based on the tests that are performed with probes 36.

For example, it may be desirable to form probe structures 14 with multiple probes 36 and corresponding probe contacts 38 to test the structural integrity of a device under test at many test points. In this scenario, a number of probe contacts 38 equal to the number of test points may be inserted into corresponding probes 36 and each of the probe mounts 34 may be positioned so that probe contacts 38 contact the device under test at the desired test points.

Figure 6:
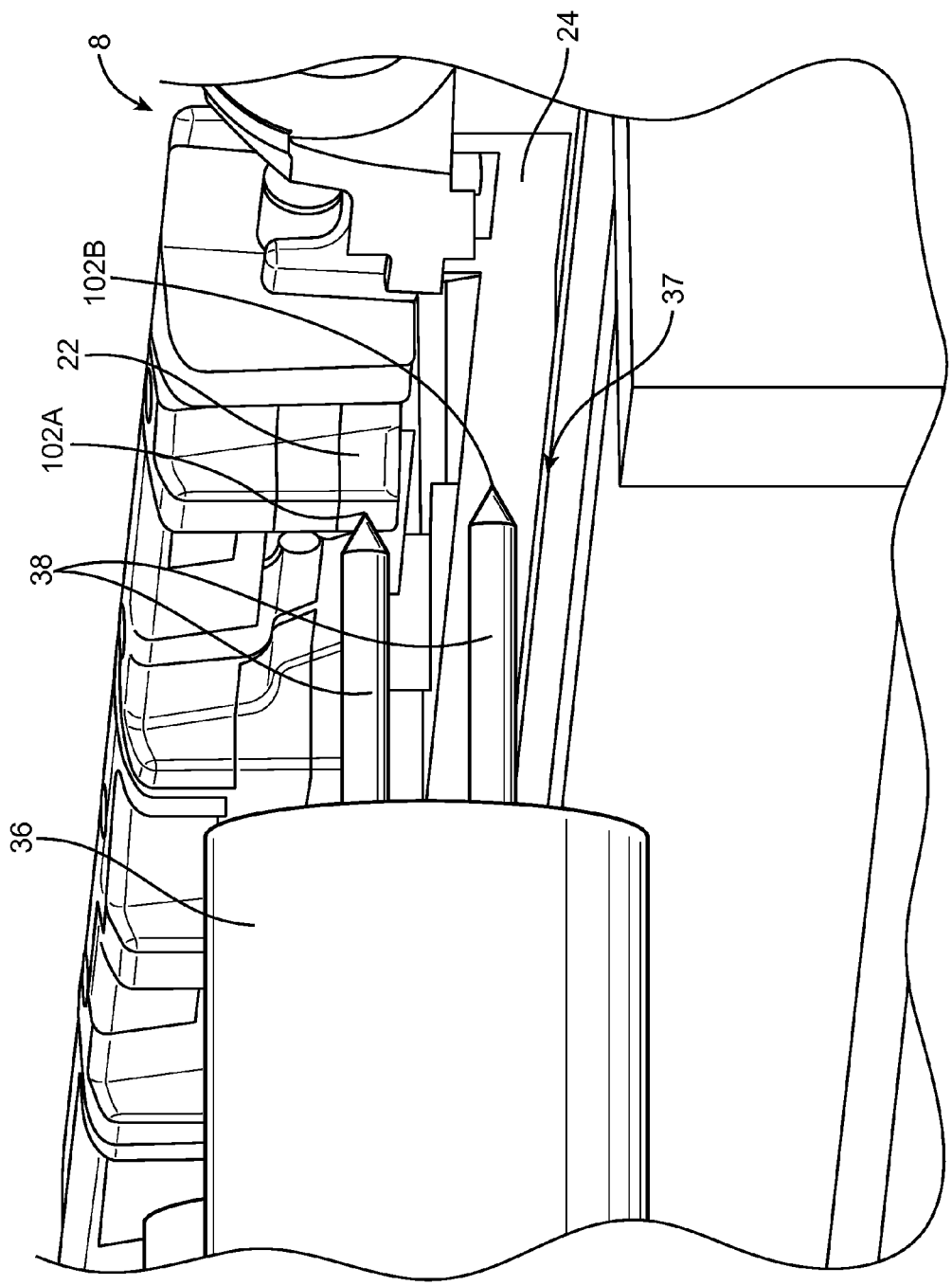
FIG. 6 shows an illustrative view of probes that may be configured to couple to a device under test at desired test points in accordance with an embodiment of the present invention.

FIG. 6 shows an illustrative view of probe contacts 38 that may be inserted into a probe 36 to contact a device structure under test (e.g., a DUT 8) at desired test locations. A first probe contact 38 may contact the device structure under test at a first test point 102A and second probe contact 38 may contact device 8 a second test point 102B. Probes 36 may be configured to measure test values at the test points. For example, test point 102A may correspond to a location on antenna resonating element 22 and test point 102B may correspond to a location on grounding structure 24 that is electrically coupled to the antenna resonating element. In this scenario, probe 36 may be used to test the integrity of the electrical coupling between grounding structure 24 and antenna resonating element 22 by transmitting test signals to the device under test and measuring the responses to the test signals.

Test procedures such as those used during radio-frequency testing may be performed using probes 36. For example, it may be desirable to perform radio-frequency testing to identify structural faults or faulty coupling between elements of a device under test. In the example of FIG. 6, it may be desirable to determine whether an electrical coupling between test point 102A (e.g., an antenna resonating element) and test point 102B (e.g., a test point on a nearby grounding structure) is faulty. To perform radio-frequency testing, probes 36 may be positioned (e.g., using associated adjustable structures 32) to contact test points 102A and 102B and test signals may conveyed through some of probes 36. The response of the device structure under test to the test signals may be measured to identify the existence of structural faults, faulty coupling, or other manufacturing defects that affect the response of the device under test to the test signals.

In one embodiment, a radio-frequency test signal may be transmitted from probes 36 to an antenna resonating element via test point 102A (e.g., transmitted via a corresponding probe contact 38). An input reflection coefficient (e.g., a complex impedance coefficient or S11 measurement) may be obtained by using the probes to measure how much of the transmitted radio-frequency test signal is reflected. The input reflection coefficient may be compared to a reference input reflection coefficient. The reference input reflection coefficient may correspond to how much of a radio-frequency test signal is reflected by a device under test that does not contain manufacturing faults or defects. Test procedures that measure input reflection coefficients may sometimes be referred to as S11 parameter measurements or complex impedance measurements.

In another embodiment, S21 parameter measurements (sometimes referred to as complex forward transfer measurements) may be made by measuring how much of a radio-frequency test signal transmitted by a first test probe 36 positioned at a first location reaches a second test probe positioned at a second location. For example, a first test probe 36 coupled to test point 102A and 102B may be used to measure how much of a radio-frequency test signal transmitted by a second test probe 36 at a second location reaches the first test probe. In this scenario, a measured transmittance value (e.g., a value corresponding to how much of the radio-frequency test signal reaches test point 102B and 102A) may be compared to a reference transmittance value (e.g., a reference value obtained by performing S21 parameter measurements on a device known to have been manufactured properly) to identify whether or not manufacturing defects exist.

In situations in which device structures under test 8 are fault free, S11 and S21 measurements will have values that are relatively close to baseline measurements on fault-free structures (sometimes referred to as reference structures or "gold" units). In situations in which device structures under test 8 contain a fault (e.g., a structural fault) that affects the electromagnetic properties of device structures under test 8, the S11 and S21 measurements will exceed normal tolerances. When test equipment 12 determines that the S11 and/or S21 measurements have deviated from normal S11 and S21 measurements by more than predetermined tolerance values, test equipment 12 can alert an operator that device structures under test 8 likely contain a fault and/or other appropriate action can be taken.

For example, an alert message may be displayed on a display associated with test equipment 12. The faulty device structures under test 8 may then be reworked to correct the fault or may be scrapped. With one suitable arrangement, an operator of test equipment 12 may be alerted that device structures under test 8 have passed testing by displaying an alert message such as a green screen and/or the message "pass" on a display. The operator may be alerted that device structures under test 8 have failed testing by displaying an alert message such as a red screen and/or the message "fail" on display 200 (as examples). If desired, S11 and/or S21 data can be gathered over limited frequency ranges that are known to be sensitive to the presence or absence of faults (e.g., coupling faults between components of device structures under test 8). This may allow data to be gathered rapidly (e.g., so that the operator may be provided with a "pass" or "fail" message within less than 30 seconds, as an example).

Device structures under test may include a cosmetic portion 37. It may be desirable when testing to avoid physical contact between probe contacts 38 and cosmetic portion 37. For example, cosmetic portion 37 may be formed of materials such as aluminum, magnesium, plastic, or anodized surfaces that can be easily scratched by probe contacts 38. This example is merely illustrative. Cosmetic portion 37 may be formed from an oxidization layer, anodization layer, metals, plastics, or other easily damaged materials. Cosmetic portion 37 may be formed as part of a housing structure, grounding structure, antenna element, or other device structures that may be easily damaged by contact with probe contacts 38.

To minimize damage to cosmetic portion 37, an insulating material may be interposed between probe contacts 38 and cosmetic portion 37. In this scenario, the insulating material may be formed from a material that minimizes damage to cosmetic portion 37 (e.g., insulating foam material). The insulating material may prevent probe contacts 38 from contacting cosmetic portion 37 and thereby prevent the probes from physically damaging cosmetic portion 37. The insulating material may help prevent test signals that are being conveyed via probe contacts 38 from shorting to cosmetic portion 37.

It may be desirable to test some portions of a device under test without direct physical contact between probe contacts 38 and desired test points. For example, it may be desirable to test cosmetic portion 37 without damaging a surface of cosmetic portion 37. Capacitive testing may be used to test device structures 8 with an insulating material interposed between probe contacts 38 and desired test points.

Figure 7:
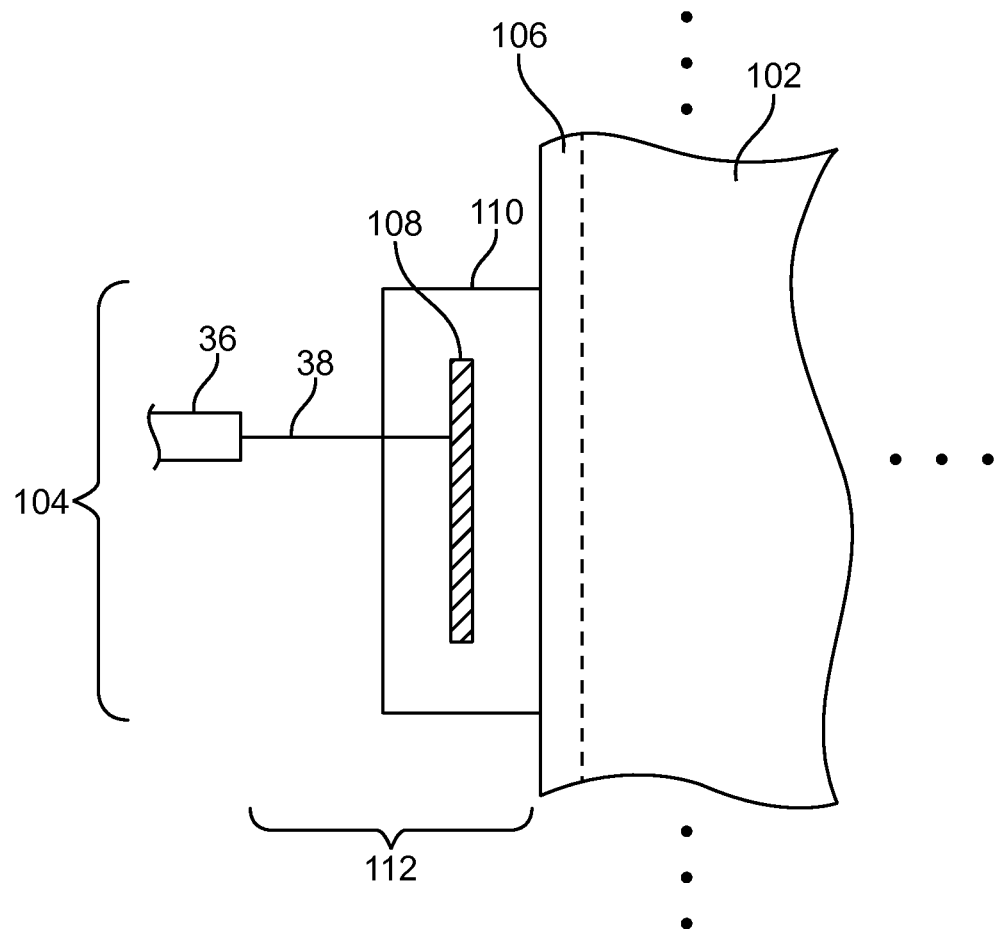
FIG. 7 is an illustrative diagram of a probe pad that may provide capacitive coupling between a probe and a test point in accordance with an embodiment of the present invention.

FIG. 7 shows an illustrative scenario in which a probe 36 may be electrically coupled to a conductive structure 102 at a test location 104 without damaging conductive structure 102. As shown in FIG. 7, probe contact 38 may be electrically coupled to probe pad 108 (e.g., by physically contacting probe pad 108). A dielectric material 110 (e.g. a dielectric material) may be interposed between probe pad 108 and conductive structure 102. Dielectric material 110 may be, for example, a sheet of polymer such as a polyimide sheet in a flexible printed circuit ("flex circuit"). Probe pad 108 may be formed from a metal trace in the flex circuit. When placed against conductive structure 102, conductive probe pad 108 and a surface of conductive structure 102 may form a parallel plate capacitor. Because probe 36 is not used to directly probe conductive structure 102, the surface of conductive structure 102 will generally not be scratched (e.g., by probe contact 38) during testing, which may be helpful when conductive structure 102 has a cosmetic surface that should not be damaged during testing.

A combination of probe 36 that contacts probe pad 108 via a probe contact 38 that is surrounded by dielectric material 110 may sometimes be referred to herein as a capacitive probe (e.g., capacitive probe 112 that may be used to perform capacitive testing on a device under test).

Dielectric material 110 covers probe pad 108 and, when capacitive probe 112 is placed against the surface of conductive structure 102 during testing, dielectric material 110 electrically isolates (insulates) probe pad 108 from conductive structure 102. Because electrical coupling is achieved without requiring direct metal-to-metal contact between probe pad 108 and conductive structure 102 or between probe contact 38 and conductive structure 102, satisfactory electrical coupling can be achieved at radio frequencies even in the presence of an oxide or other coating that may give rise to a non-negligible contact resistance when probing the conductive structure with pins.

The capacitive electrical coupling between probe pad 108 and conductive structure 102 may be used to perform radio-frequency testing (e.g., S11 testing, S21 testing, or other types of radio-frequency testing). Test signals may be transmitted from probes 36 to test location 104 (e.g., a test location 104 corresponding to desired test points on a device under test) via capacitive probe 112.

Test signals may be received using capacitive probe 112. For example, an S11 test may be performed using capacitive probe 112. During the S11 testing, a radio-frequency test signal may be transmitted from probe 36 to test location 104 via capacitive probe 112. S11 coefficients may be obtained by using capacitive probe 112 to measure how much of the radio-frequency test signal is reflected.

As shown in FIG. 7, conductive structure 102 may, if desired, be covered with a dielectric coating such as coating 106. For example, conductive structure 102 may be formed from metal with a layer of plastic, a native oxide such as a native oxide on stainless steel or other metals having a thickness of less than 5 microns, or other dielectric films. Coating 106 may be associated with a protective coating, a logo on a housing member, a cosmetic trim, or other structures. Interior portions of conductive structures, exterior portions (i.e., cosmetic exterior portions), combinations of interior and exterior portions, or other suitable areas on conductive structure 102 may be probed with capacitive probe 112 if desired.

Figure 8:
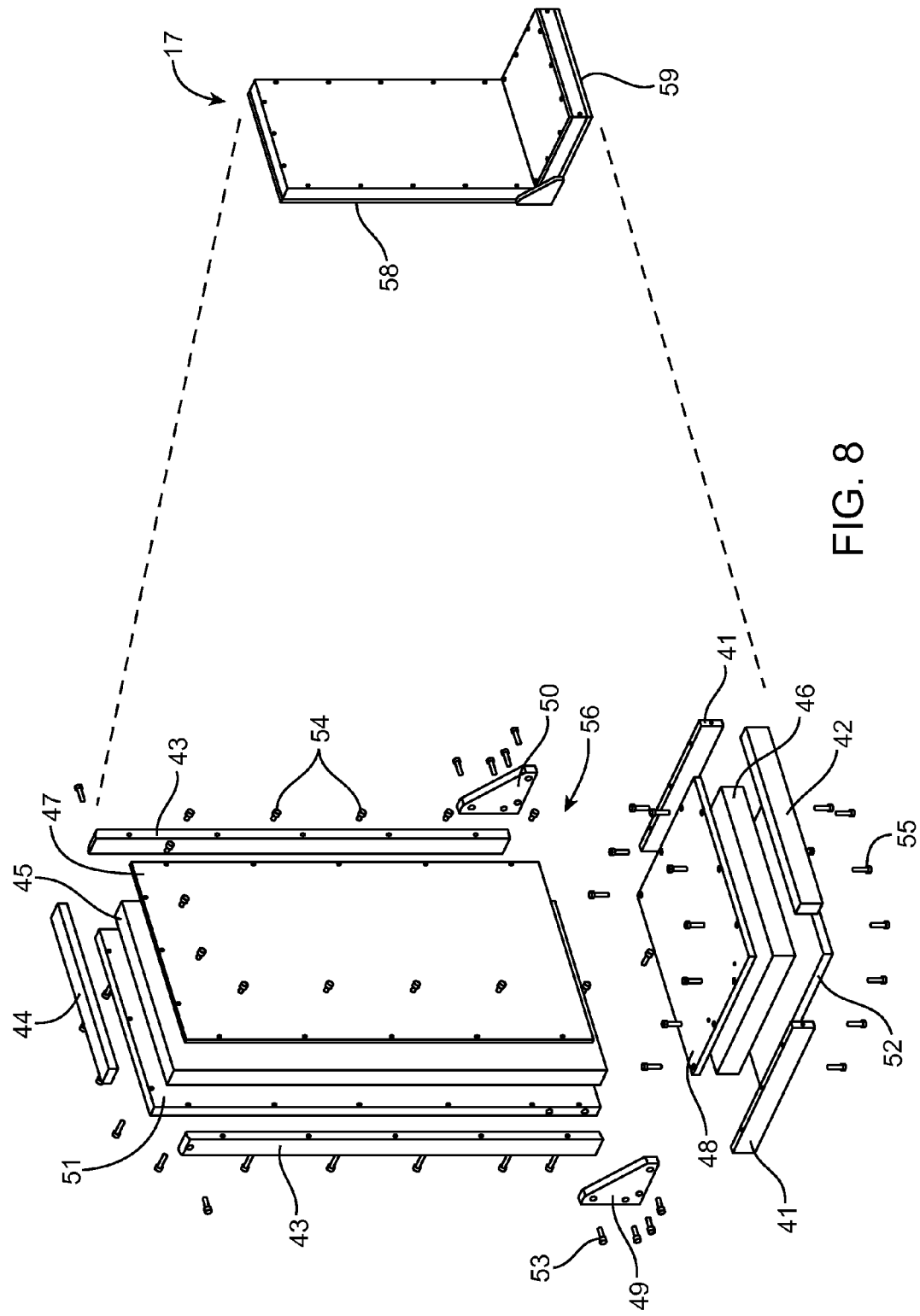
FIG. 8 is an illustrative diagram of an absorber block that may absorbs radio-frequency signals in accordance with an embodiment of the present invention.

FIG. 8 shows an illustrative view of an absorber block 17 which may provide radio-frequency isolation for test fixture 10. Absorber block 17 may be assembled via screws 53, 54, 55, and 56.

Absorber block 17 may include a horizontal structure 58 formed from a bottom plate 52, side plates 41 and 42, and a top plate 48. Horizontal structure 58 may be formed underneath other components of test fixture 10 (e.g., horizontal structure 58 may be formed underneath other support structures such as test stage 16 and probe structures 14). Bottom plate 52, side plates 41 and 42, and top plate 48 may be formed from materials such as acrylics, plastics, or insulating materials. The horizontal structure may include a radio-frequency absorber 46 formed from a material that attenuates radio-frequency signals.

Absorber block 17 may include one or more vertical structures 59 each formed from a front plate 47, back plate 51, and side plates 43 and 44. Plates 47, 51, 43, and 44 may be formed from acrylic materials such as poly-methyl methacrylate (PMMA). The vertical structures may contain a radio-frequency absorber 46 formed from a material that attenuates radio-frequency signals.

Radio-frequency absorbers 46 may be formed from dielectric materials (e.g., polyurethane foam sheets that have been injected with a conductive solution), magnetic materials (e.g., iron or ferrite material), or other materials suitable for absorbing radio-frequency signals.

Horizontal structure 58 and vertical structure 59 may be coupled via structural boards 49 formed from a non-conductive material such as a plastic material (e.g., polyoxybenzylmethylenglycolanhydride). Horizontal structure 58 may be located underneath probe structures 14, test stage 16, and device under test 8. Vertical structure 59 may form a side wall that absorbs radio-frequency signals. If desired, additional vertical structures 59 may be added to each side of horizontal structure 58 to provide an absorber block 17 with radio-frequency absorption on all sides. If desired, an additional horizontal structure 58 may be formed on top of vertical structure 59 and bottom horizontal structure 58. In this scenario, the combined horizontal structures and vertical structures may substantially enclose test fixture 10.

Absorber block 17 may be used to isolate test fixture 10 from a testing environment. Absorber block 17 may prevent radio-frequency signals originating from external sources from affecting probes such as probes 36 during test measurements. For example, absorber block 17 may help isolate test fixture 10 from radio frequency signals that originate from nearby test systems, mobile cell phones, laptop devices, or other electronic devices. Absorber block 17 may also help prevent radio-frequency test signals generated by associated test equipment 12 from leaving test system 2 (e.g., absorber block 17 in a first test system may help prevent radio-frequency test signals generated by the first test system from reaching a second test system).

Figure 9:
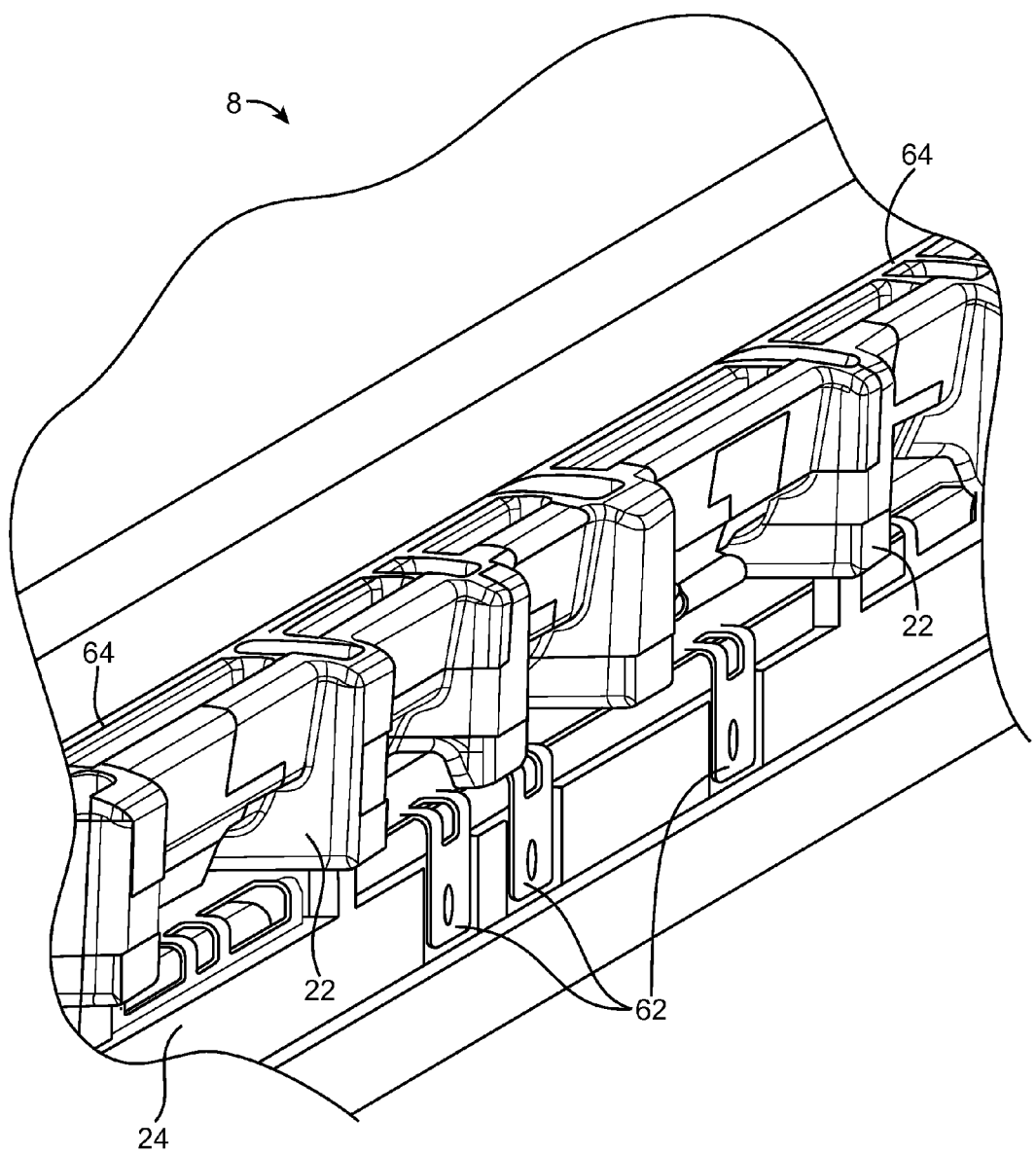
FIG. 9 shows a perspective view of a radio-frequency antenna that is electrically coupled to conductive ground structures via conductive braces.

FIG. 9 shows an illustrative view of a device structure under test 8 that may be tested. As shown in FIG. 9, device structure under test 8 may include a radio-frequency antenna that is electrically coupled to conductive ground structures 24 via conductive braces 62 (sometimes referred to as waterfalls). The radio-frequency antenna may include plastic housing structure 64 and antenna resonating elements 22.

It may be desirable to identify whether the device under test of FIG. 9 contains structural faults. For example, it may be desirable to test the electrical coupling between the radio-frequency antenna and conductive ground structures 24 (e.g., if conductive braces 62 do not properly contact conductive ground structures 24, normal operation of the radio-frequency antenna may be affected).

Figure 10:
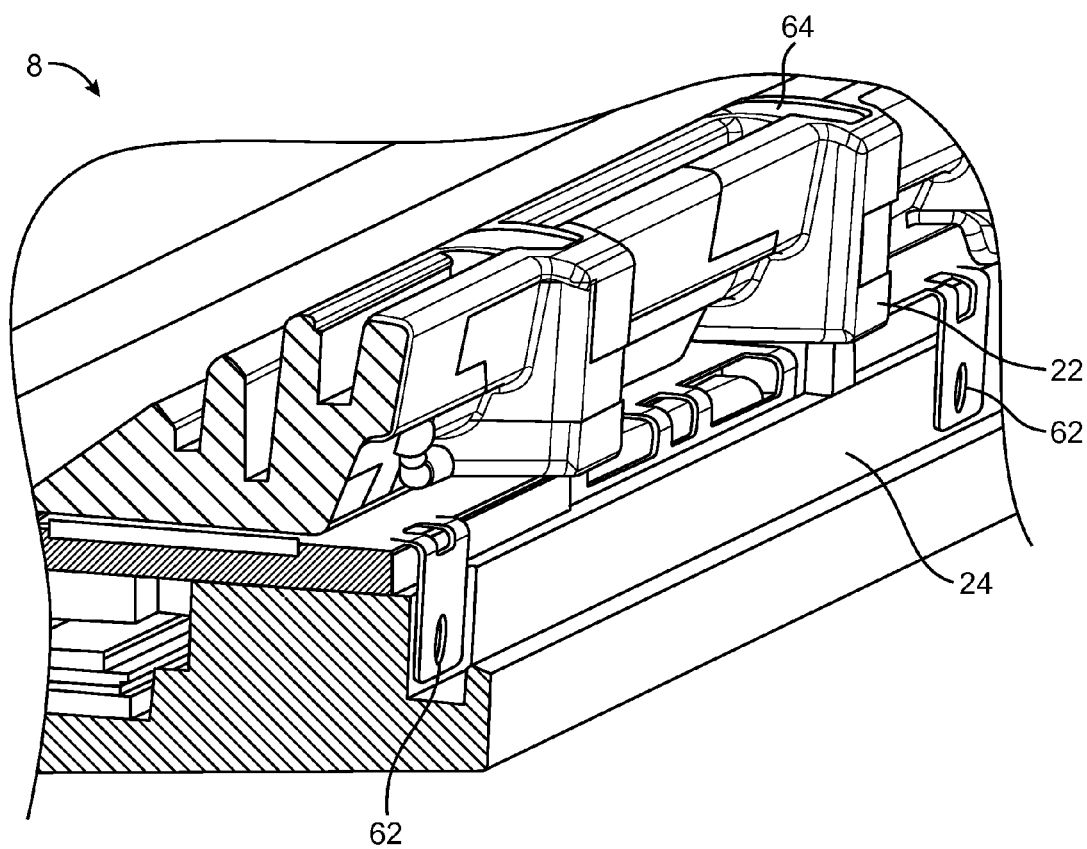
FIG. 10 shows a cross-sectional side view of the radio-frequency antenna of FIG. 9.

FIG. 10 shows an illustrative cross-sectional side view of the radio-frequency antenna of FIG. 9 that is electrically coupled to conductive ground structures 24 via conductive braces 62.

Figure 11:
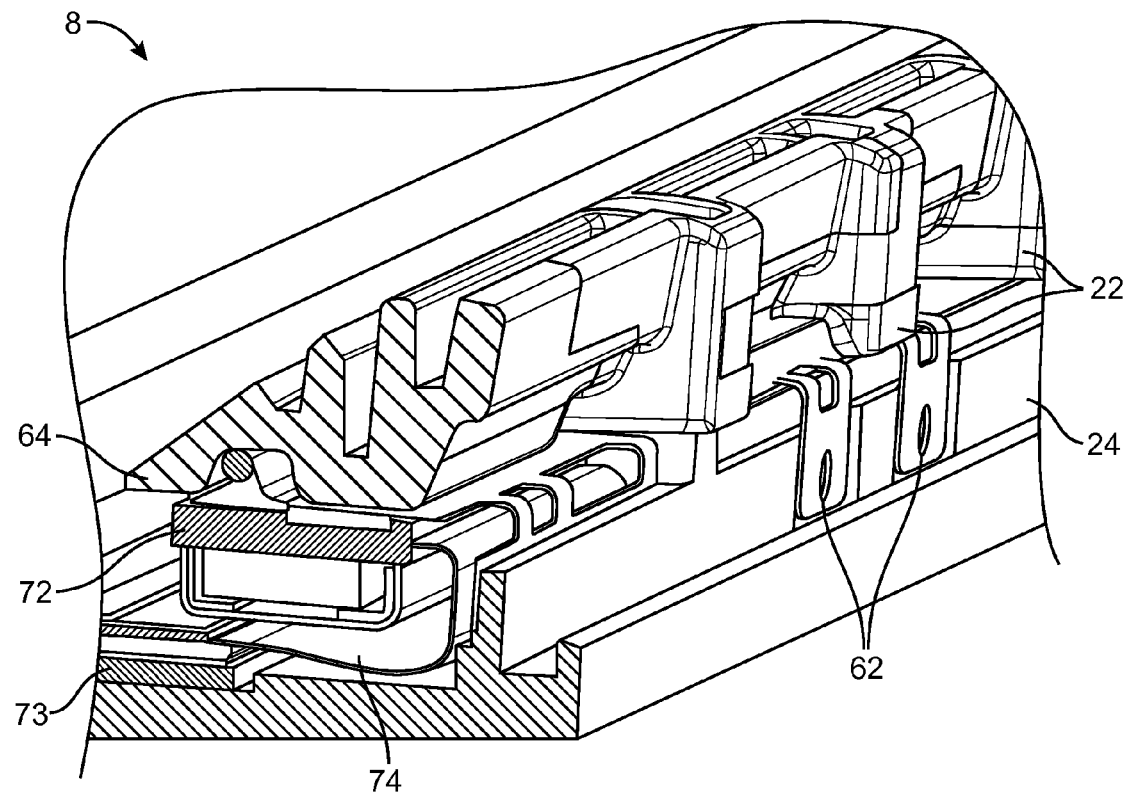
FIG. 11 shows a cross-sectional side view of a radio-frequency antenna that located on top of a display driver.

FIG. 11 shows an illustrative cross-sectional side view of a device structure under test 8 that may be part of a wireless device (e.g., a laptop). Device under test 8 may include a radio-frequency antenna located on top of a display driver 72. The radio-frequency antenna may be coupled to a conductive laptop housing structure 24 via conductive braces 62. The display driver 72 may be coupled to a laptop display 73 via a flexible path 74 (e.g., a flex circuit). Display driver 72 may provide display signals to laptop display 73 via path 74.

Figure 12:
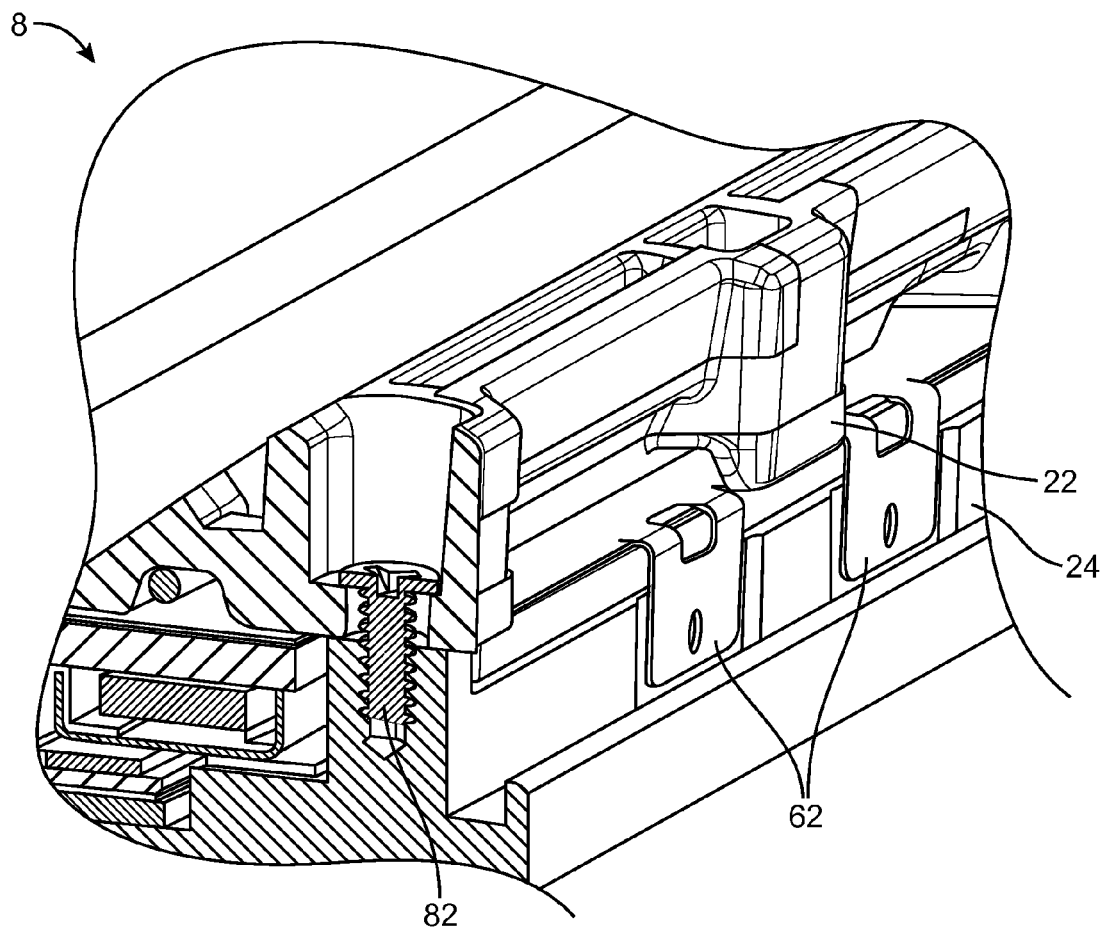
FIG. 12 shows a cross-sectional side view of the radio-frequency antenna of FIG. 11 that is coupled to a conductive laptop housing structure via conductive braces and conductive screws.

FIG. 12 shows an illustrative cross-sectional perspective view of the device structure under test 8 of FIG. 11 that has a radio-frequency antenna coupled to a conductive laptop housing structure 24 via conductive braces 62 and conductive screws 82. Conductive screws 82 and conductive braces 62 may provide grounding paths between the radio-frequency antenna and conductive laptop housing structure 24. It may be desirable to test the integrity of the coupling between conductive braces 62 and housing structure 24 or the coupling between conductive screws 82 and housing structure 24 (e.g., to identify faults that may affect normal operation of the radio-frequency antenna).

Figure 13:
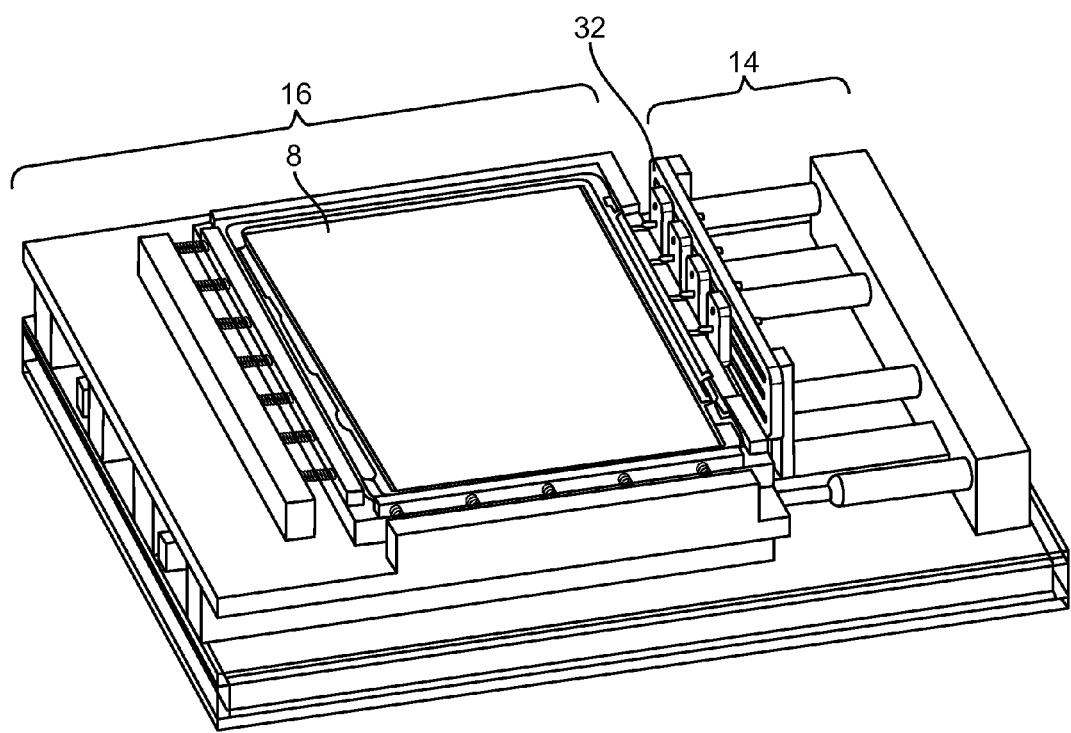
FIG. 13 is an illustrative diagram of a test stage operable to hold a device under test with a radio-frequency antenna and adjustable probe structures operable to couple to the device under test at desired test points in accordance with an embodiment of the present invention.

FIG. 13 shows an illustrative test fixture with a device structure under test 8 located on a test stage 16. DUT 8 may be tested using probe structures 14 that may be adjusted by adjustable structures 32 to electrically couple to test points on DUT 8. For example, probe structures 14 may be adjusted in three-dimensional space to electrically couple to locations on a radio-frequency antenna and couple to locations on a conductive housing structure.

Figure 14:
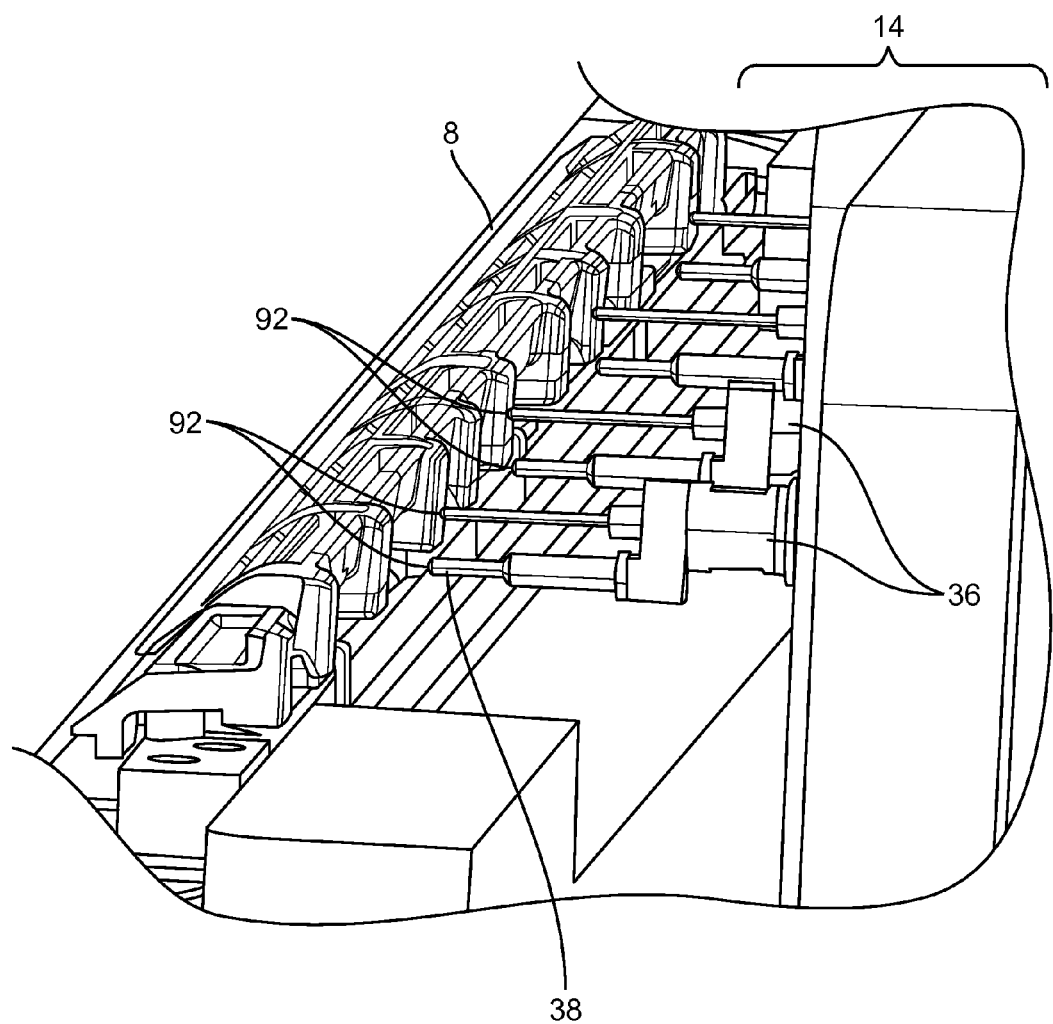
FIG. 14 shows an illustrative close-up view of adjustable probe structures with probes that may be configured to couple to test points on a device structure under test in accordance with an embodiment of the present invention.

FIG. 14 shows an illustrative close-up view of the test points of FIG. 13. As shown by FIG. 14, probe structures 14 may include probes 36 that may be coupled to test points 92 on device 8. Probe contacts 38 may be mounted in probes 36. Probe structures 14 may be adjusted in three-dimensional space (e.g., along first, second and third orthogonal axes or dimensions in three-dimensional space) to reliably, precisely, and accurately couple probes 36 to various desired test points 92 located on DUT 8. Test procedures (e.g., test procedures associated with S-parameter testing) may be performed by transmitting test signals to device under test 8 via probes 36.

Device structures under test 8 may have components that vary in exact size and shape. Manufacturing tolerances may introduce slight variations in component dimensions, which may alter the optimal locations of test points 92. By providing a test fixture with adjustable probe structures 14, the positions of probes 36 may be adjusted in real-time (e.g., during manufacturing) to contact each device structure under test 8 at test points that are optimal for that particular device structure.

Figure 15:
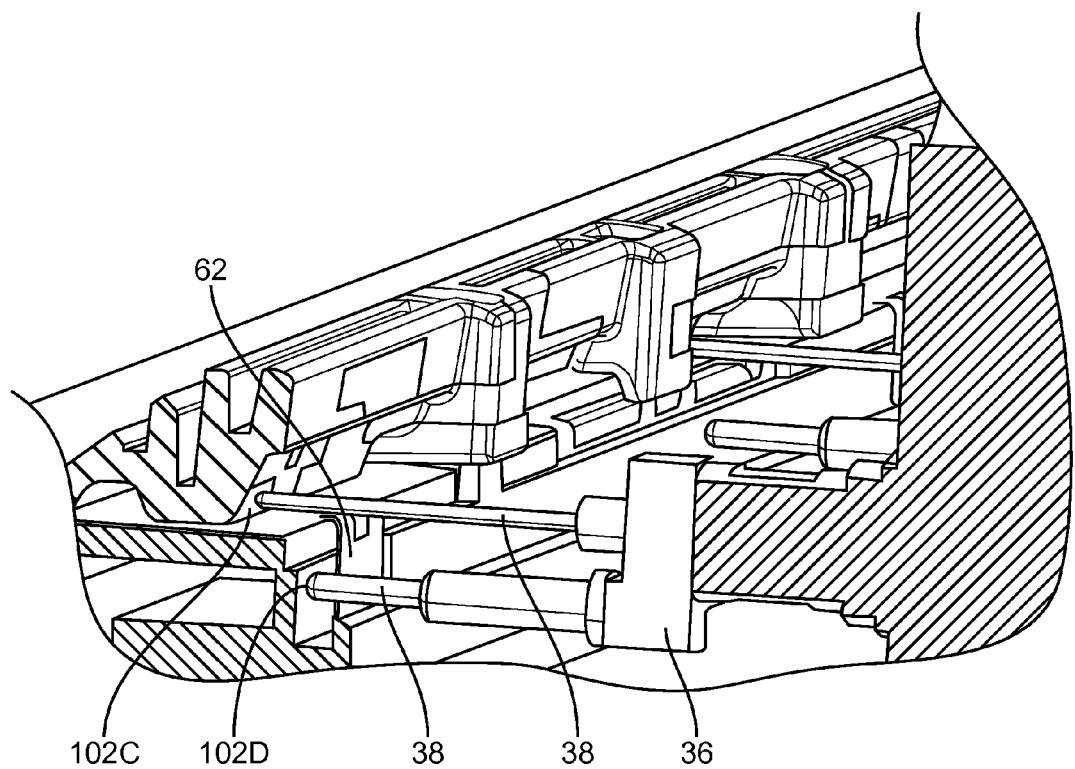
FIG. 15 shows an illustrative close-up view of a first set of test points from FIG. 14 in accordance with an embodiment of the present invention.

FIG. 15 shows an illustrative close-up view of a first set of test points from FIG. 13. As shown in FIG. 14, probe 36 may be adjusted to contact a first test point 102C of the first set of test points (e.g., a test location on an antenna resonating element) and a second test point 102D of the first set of test points (e.g., a test point on a conductive ground structure). Test point 102C may correspond to an antenna resonating element. Test point 102D may correspond to a location on a conductive ground structure near test point 102C. The antenna resonating element and conductive ground structure may be coupled via a brace 62 that provides an electrical path between the antenna resonating element and conductive ground structure. Radio-frequency test procedures may be performed to test the integrity of the electrical path provided by brace 62 (e.g., the path between the antenna resonating element corresponding to test point 102C and the conductive ground structure corresponding to test point 102D).

Figure 16:
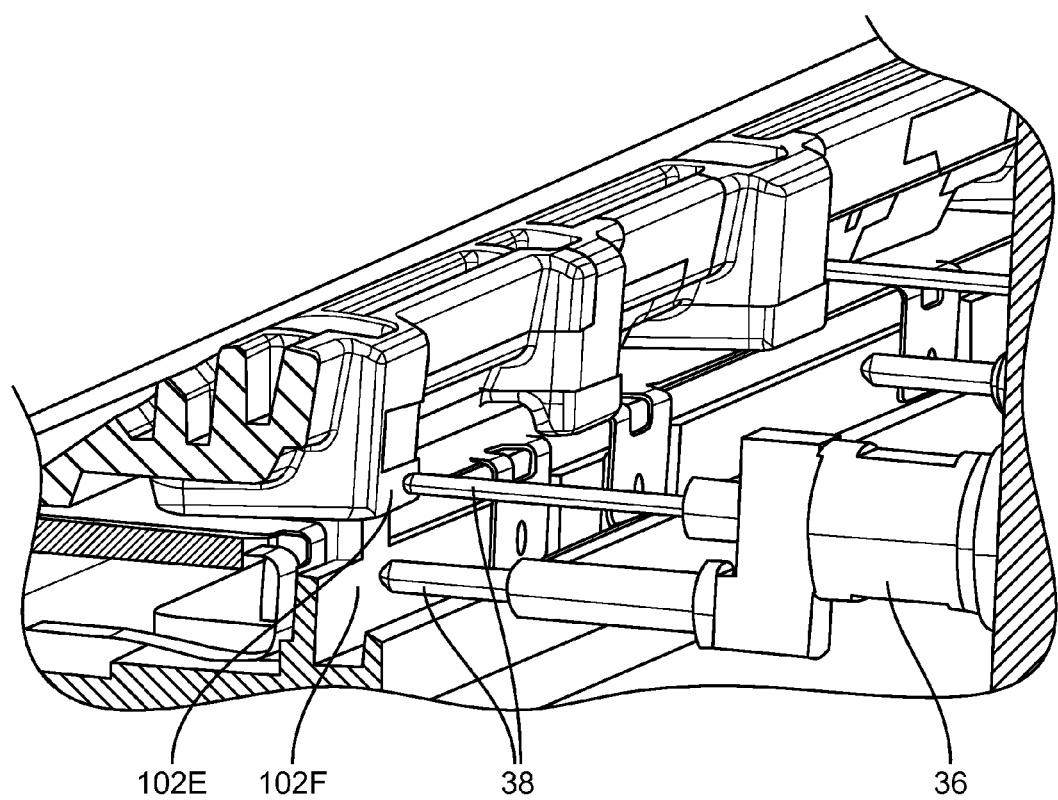
FIG. 16 shows an illustrative close-up view of a second set of test points from FIG. 14 in accordance with an embodiment of the present invention.

FIG. 16 shows an illustrative close-up view showing a second set of test points from FIG. 13. As shown in FIG. 15, probe 36 may be adjusted to contact a first test point 102E of the second set of test points and a second test point 102F of the second set of test points. Test point 102F may correspond to a location on a conductive ground structure. Test point 102E may correspond to an antenna resonating element that is coupled to the conductive ground structure (e.g., via a metal screw 82 as shown in FIG. 12). Radio-frequency testing may be performed to test the integrity of the coupling between the antenna resonating element at test point 102E and the conductive ground structure at test point 102F.

Figure 17:
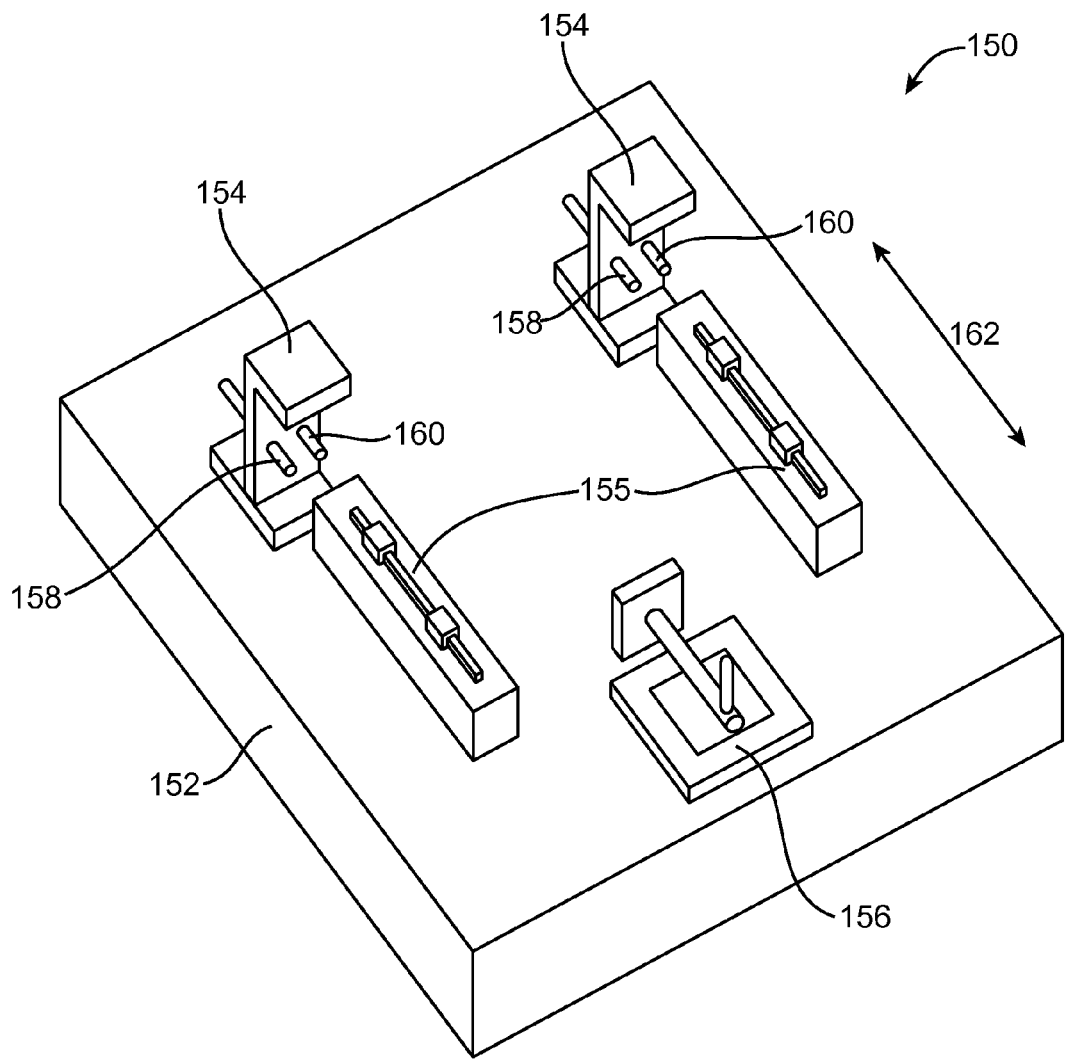
FIG. 17 shows an illustrative perspective view of a support structure that may be used to support an adjustable test stage in accordance with an embodiment of the present invention.

FIG. 17 shows an illustrative support structure 150 operable to hold an associated test stage and device under test in a stable configuration for testing. In one embodiment, support structure 150 may be located on or enclosed by an absorber block that isolates the support structure from a testing environment. Support structure 150 may include a support block 152. Support structure 150 may include limit blocks 158, clamp 156 (sometimes referred to as a toggle clamp), and adjusting mechanism 155.

A test stage (and an associated device under test) may be placed on adjusting mechanisms 155. Adjusting mechanisms 155 may allow the positioning of the test stage to be adjusted horizontally along the length of adjusting mechanisms 155 (e.g., adjusting mechanisms 155 may allow a test stage to be adjusted along axis 162).

Clamp 156 may exert a clamping force on a test stage placed on adjusting mechanisms 155. The clamping force may be exerted along axis 162 towards limiting block 154. Limiting block structures 154 or other suitable motion limiting structures may be provided to limit the motion of the test stage along adjusting mechanisms 155. Limiting block structures 154 may include a limiting peg 160 (sometimes referred to herein as a limit stick). Limiting peg 160 may determine the positioning of the test stage. For example, clamp 156 may exert a clamping force on the test stage that pushes the test stage towards limiting blocks 154. The clamping force may force the test stage against limiting pegs 160, thereby holding the test stage in a stable position for testing.

Buffers 158 may help prevent damage to the test stage or limiting pegs that is caused by the clamping force exerted by clamp 156. For example, buffers 158 may be hydraulic spring buffers that help accommodate the clamping force exerted on the test stage. In this scenario, hydraulic spring buffers 158 may help limiting pegs 160 receive and accommodate a test stage that is pushed by a clamp 156 without damaging the test stage or limiting pegs 160.

Figure 18:
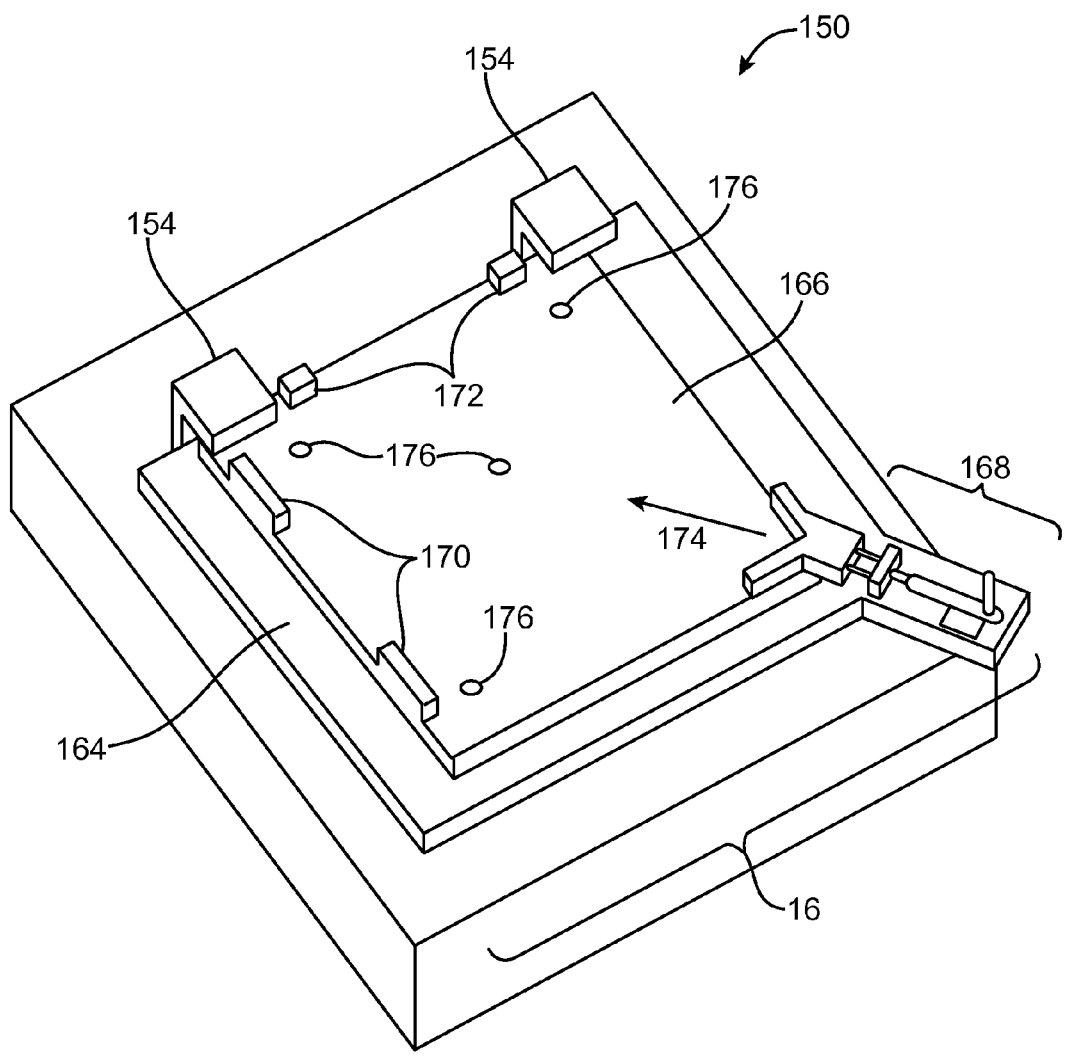
FIG. 18 shows an illustrative perspective view of a support structure that may be used to hold a test stage in accordance with an embodiment of the present invention.

A test stage 16 (e.g., test stage 20 of FIG. 1) may be placed on adjusting mechanisms 155 of FIG. 17. As shown in FIG. 18, test stage 16 may include a first layer 164 and a second layer 166. Layer 166 and a clamp 168 (sometimes referred to as a toggle clamp) may be formed on layer 164. A test unit (e.g., a DUT 8) may be placed on top of the second layer for testing. During testing, clamp 168 may exert a clamping force on the device under test. The clamping force may be exerted in direction 174 (e.g., in a diagonal direction across layer 166). In other words, clamp 168 may clamp a DUT to the test stage with opposing horizontal and vertical locking blocks while radio-frequency tests are being performed.

Suction cups 176 may be formed on layer 166 to help attach the test unit to the test stage. Suction cups 176 may be formed of rubber or other desirable materials. The test unit may be attached to the test stage via air pressure (e.g., the test unit may be attached to the test stage by air pressure imbalances that are produced by the deformation of suction cups 176 when a test unit is placed on top of layer 166).

Vertical locking blocks 172 and horizontal locking blocks 170 may be formed on layer 166. Vertical locking blocks 172 and horizontal locking blocks 170 may together provide a structure for clamp 168 to pin a test unit against (e.g., horizontal locking block 170 may accommodate a horizontal portion of a clamping force exerted by clamp 168 in diagonal direction 174 and vertical locking block 170 may accommodate a vertical portion of the clamping force exerted in diagonal direction 174). By clamping a device under test to layer 166 via clamp 168 and locking blocks 170 and 172, the stability of a test unit during testing may be improved, thereby improving the consistency and reliability of test procedures that are performed.

Figure 19:
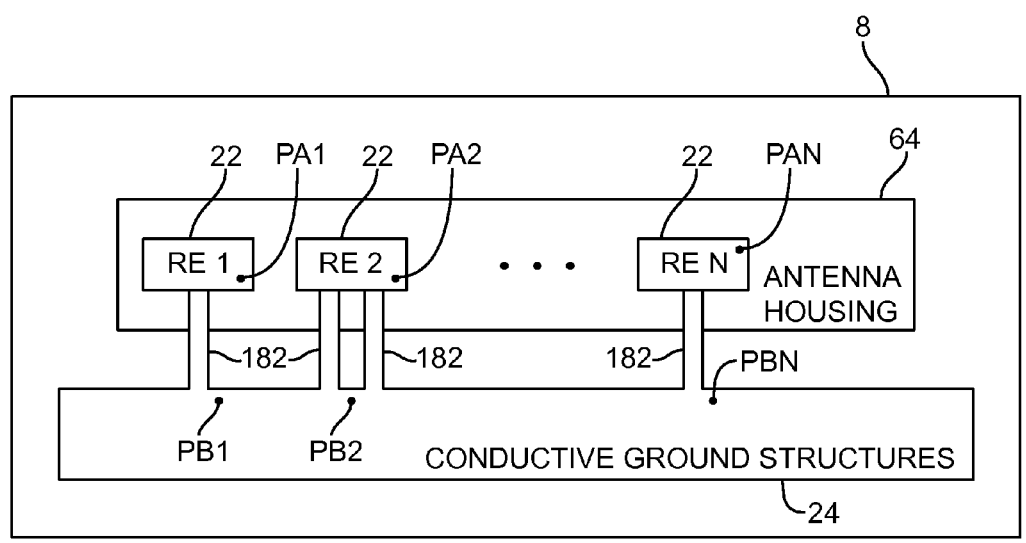
FIG. 19 shows an illustrative perspective view of a support structure with a test stage that may be used to hold a device under test in accordance with an embodiment of the present invention.

FIG. 19 is a block diagram of a device structure under test 8 and illustrative probe test locations. As shown in FIG. 19, DUT 8 may include antenna housing 64 and conductive ground structures 24. Antenna housing 64 may include antenna resonating elements 22 (e.g., RE 1, RE 2, RE N, etc.). Each antenna resonating element 22 may be electrically coupled to conductive ground structures 24 via paths 182. Paths 182 may correspond to metal screw 82 and conductive braces 62 of FIG. 12 (as examples). To test the integrity of conductive paths 182, probes such as probes 36 of FIG. 16 may be coupled to antenna resonating elements 22 and conductive ground structures 24. In the example of FIG. 19, probe contacts PA1 and PB1 may correspond to a first probe. Probe contacts PA2 and PB2 may correspond to a second probe. Probe contacts PAN and PBN may correspond to a third probe. Probe contacts PA1, PA2, and PAN may be simultaneously coupled to respective antenna resonating elements PA1, PA2, and PAN. Probe contacts PB1, PB2, and PBN may be coupled to locations on conductive ground structures 24. Radio-frequency tests such as S21 and S11 tests may be performed using the probes to test the integrity of each conductive path 182. The radio-frequency tests may be performed using pairs of probes (e.g., a pair of probes may be formed from a first probe including probes PA1 and PB1 and a second probe including probes PA2 and PB2). If desired, the radio-frequency tests may be performed using several pairs of probes simultaneously or in sequence.

The number of conductive paths 182 shown in FIG. 19 is merely illustrative. Any number of conductive paths 182 may exist depending on the electronic device structure under test.

Figure 20:
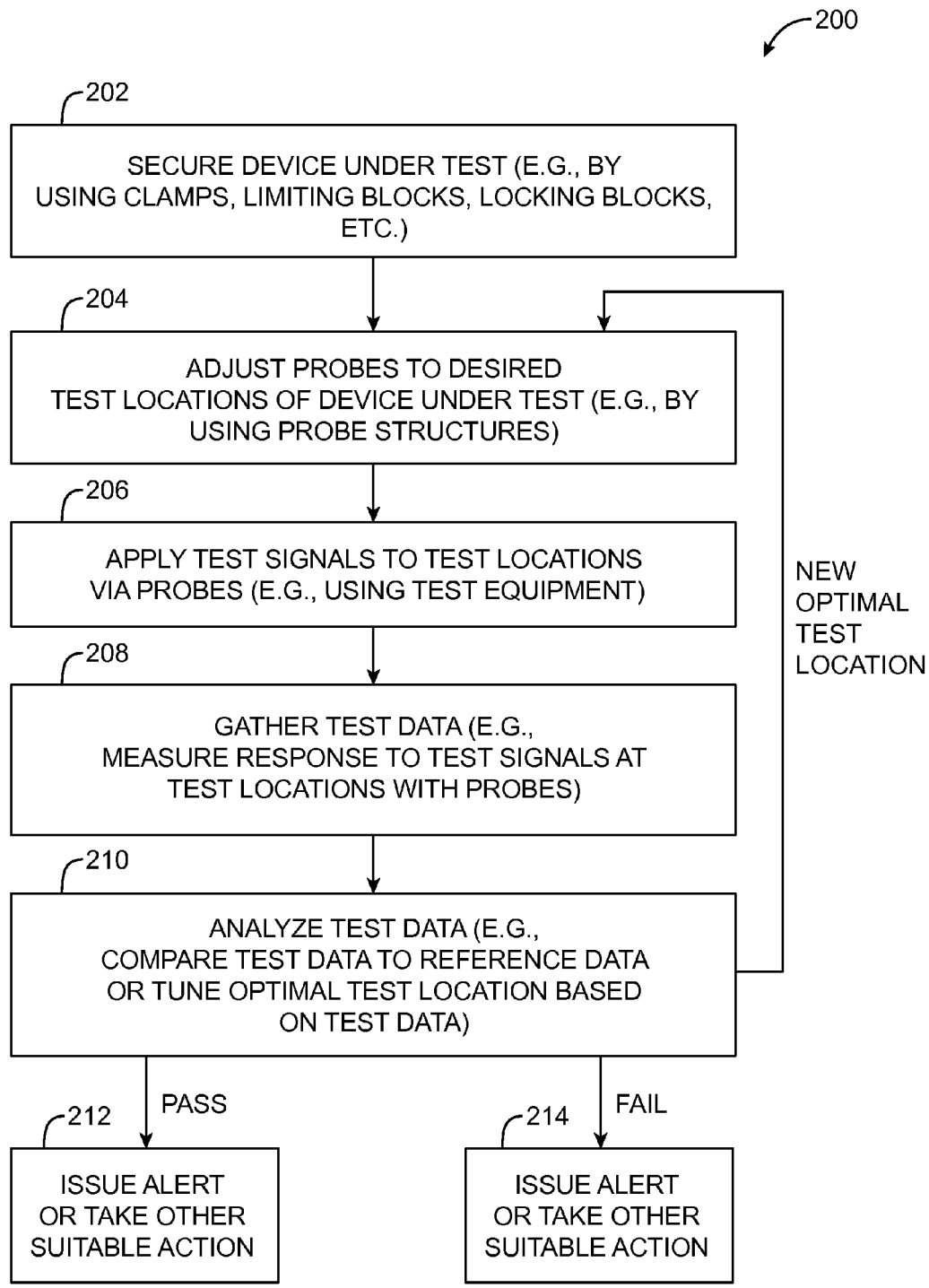
FIG. 20 is a flowchart showing illustrative steps that may be performed to identify structural faults using a test system with a test fixture in accordance with an embodiment of the present invention.

FIG. 20 shows illustrative steps that may be performed to test device structures using test system 2. As an example, the steps of FIG. 20 may be performed during assembly of an electronic device to identify device structures that are unsuitable for complete assembly.

In step 202, a device structure under test (e.g., DUT 8) may be secured on a test stage and a support structure (e.g., test stage 16 and support structure 17). The device structure under test may be placed on the test stage manually (e.g., by an operator) or automatically (e.g., by a robotic device). The device structure under test may be secured using clamps, locking blocks, limiting blocks, or other structures desirable for holding a device under test in a stable configuration. The support structure may include an absorber block that helps absorb undesired radio-frequency signals.

In step 204, probes may be adjusted to desired test locations on the device structures under test. For example, adjustable probe structures 14 and adjusting mechanisms 155 may be adjusted so that probes 36 contact many antenna resonating elements and conductive ground structures of the device structures under test. The probes may be adjusted manually (e.g., by an operator) or automatically (e.g., by automated testing machines or robots).

In step 206, test signals (e.g., radio-frequency test signals) may be applied to the desired test locations. For example, test equipment that is coupled to probe structures 14 may provide radio-frequency test signals. In this scenario, the radio-frequency test signals may be transmitted to the device structures under test at the desired test locations via probes 36.

In step 208, test data may be gathered using the probes. For example, test equipment may use probes 36 to receive and measure responses to the test signals. The responses to the test signals may be received at the test probes that were used to transmit the test signals or at other test probes. For example, a first test probe coupled to an antenna resonating element and an antenna ground structure may be used to transmit a test signal. In this scenario, a response to the test signal may be measured with the first test probe or with a second test probe (e.g., a second test probe coupled to a second antenna resonating element at a location near the first probe).

In step 210, the gathered test data may be analyzed. The gathered test data may be compared to reference data (e.g., baseline measurements on fault-free device structures). Device structures under test may fail testing if structural faults or other faults exist that affect the device structure's response to radio-frequency test signals.

If the gathered test data does not closely match the reference data (e.g., if the gathered test data differs from the reference data by more than a predetermined tolerance), the device structures under test may fail testing and the operations of step 214 may be performed. If the gathered test data closely matches the reference data (e.g., if the gathered test data lies within a tolerance range), the device structures under test may pass testing and the operations of step 212 may be performed.

If desired, a new optimal test location may be determined by tuning the current test locations based on the gathered test data. For example, before mass production of a new device structure, the new device structure may be tested to identify the optimal test locations for the probes. In this scenario, if the gathered test data is of poor quality (e.g., if the response to the test signals is weak), a new optimal test location may be chosen and steps 204-210 may be performed with the new optimal test location.

In step 212, an alert may be issued or other suitable actions may be taken in response to a device structure that passes testing. For example, an alert may be displayed using test equipment 12 that informs an operator that the device structure under test is suitable for further assembly.

In step 214, an alert may be issued or other suitable actions may be taken in response to a device structure that fails testing. For example, an alert may be displayed using test equipment 12 that informs an operator that the device structure under test is unsuitable for further assembly. As another example, the device structure under test may be flagged for repair or removal from assembly.

In other words, an optimal set of testing locations for radio-frequency probes to couple to an electronic device structure that has one or more antenna resonating elements that are coupled to an antenna ground structure may be identified by positioning radio-frequency probes at many different potential testing locations and using test equipment to perform radio-frequency tests while the probes are coupled to the potential testing locations. Each probe may be coupled to a respective antenna resonating element and an antenna ground structure. Based on responses measured with the probes, an optimal set of testing locations may be chosen from the potential testing locations.

The foregoing is merely illustrative of the principles of this invention and various modifications can be made by those skilled in the art without departing from the scope and spirit of the invention.

What is claimed is:

1. A method of testing electronic device structures that have a plurality of antenna resonating elements and an antenna ground structure, comprising:
coupling a plurality of radio-frequency probes to the electronic device structures so that each probe has a first probe conductor directly connected to a respective one of the antenna resonating elements and each probe has a second probe conductor directly connected to the antenna ground structure; and
with test equipment coupled to the radio-frequency probes, performing radio-frequency tests on the electronic device structures using the radio-frequency probes.

2. The method defined in claim 1 wherein performing the radio-frequency tests comprises:

applying radio-frequency signals to the electronic device structures through the radio-frequency probes from the test equipment and receiving radio-frequency signals at the test equipment from the electronic device structures through the radio-frequency probes.

3. The method defined in claim 1 wherein performing the radio-frequency tests comprises identifying faults associated with insufficient electrical coupling between the resonating elements and the ground structures.

4. The method defined in claim 1 wherein the antenna resonating elements and the antenna ground structure form at least one antenna and wherein performing the radio-frequency tests comprises identifying faults in the at least one antenna.

5. The method defined in claim 1 wherein coupling the plurality of radio-frequency probes to the electronic device structure comprises positioning the radio-frequency probes using adjustable probe positioning structures.

6. The method defined in claim 5 wherein positioning the radio-frequency probes comprises adjusting positions of the radio-frequency probes in first, second, and third orthogonal dimensions in three dimensional space.

7. The method defined in claim 1 wherein performing the radio-frequency tests further comprises:
with the test equipment, comparing radio-frequency signal data gathered using the probes to reference data.

8. The method defined in claim 1 wherein performing the radio-frequency tests comprises obtaining forward transfer coefficient data using a pair of the probes.

9. The method defined in claim 1 wherein performing the radio-frequency tests comprises obtaining complex impedance data using at least one of the probes.

10. The method defined in claim 1 further comprising:
clamping the electronic device structures to a test stage while performing the radio-frequency tests.

11. The method defined in claim 1 wherein clamping the electronic device structures to the test stage comprises using a clamp and opposing horizontal and vertical locking blocks to hold the electronic device structures.

12. The method defined in claim 11 further comprising:
supporting the test stage on a sliding mechanism; and
with an additional clamp, clamping the test stage against at least one motion limiting structure.

13. A method of testing electronic device structures that have a plurality of antenna resonating elements and an antenna ground structure, comprising:
coupling a plurality of radio-frequency probes to the electronic device structures so that each probe has a first probe conductor coupled to a respective one of the antenna resonating elements and each probe has a second probe conductor coupled to the antenna ground structure, wherein coupling the plurality of radio-frequency probes to the electronic device structures comprises capacitively coupling the radio-frequency probes to the electronic device structures; and
with test equipment coupled to the radio-frequency probes, performing radio-frequency tests on the electronic device structures using the radio-frequency probes.

14. A method of identifying an optimal set of testing locations for radio-frequency probes to couple to an electronic device structure that has a plurality of antenna resonating elements that are coupled to an antenna ground structure, comprising:
with adjustable probe positioning structures, positioning the radio-frequency probes at a plurality of different potential testing locations so that each probe is coupled to a respective one of the antenna resonating elements and the antenna ground structure;
with test equipment coupled to the radio-frequency probes, transmitting radio-frequency test signals and measuring responses to the radio-frequency test signals while the radio-frequency probes are located at each of the plurality of different potential testing locations; and
based on the measured responses, identifying an optimal set of testing locations for the radio-frequency probes to couple to the electronic device structure.

15. The method defined in claim 14 wherein adjusting the positions of the radio-frequency probes comprises adjusting the positions of the radio-frequency probes along first, second, and third orthogonal axes in three dimensional space.

16. The method defined in claim 14 further comprising:
with the test equipment, calculating input reflection coefficients based on the measured responses to the radio-frequency test signals.

* * * * *